United States Patent
Nakajima et al.

(10) Patent No.: US 7,697,334 B2
(45) Date of Patent: Apr. 13, 2010

(54) NONVOLATILE SEMICONDUCTOR MEMORY DEVICE AND WRITING METHOD THEREOF

(75) Inventors: Tsutomu Nakajima, Tokyo (JP); Kenji Kozakai, Tokyo (JP); Koji Sakui, Tokyo (JP)

(73) Assignee: Sony Corporation, Tokyo (JP)

( * ) Notice: Subject to any disclaimer, the term of this patent is extended or adjusted under 35 U.S.C. 154(b) by 102 days.

(21) Appl. No.: 11/892,738

(22) Filed: Aug. 27, 2007

(65) Prior Publication Data

US 2008/0055999 A1    Mar. 6, 2008

(30) Foreign Application Priority Data

Sep. 5, 2006   (JP)  ............................... 2006-240102

(51) Int. Cl.
    *G11C 16/04*    (2006.01)
(52) U.S. Cl. ........................... 365/185.17; 365/185.18; 365/185.22; 365/185.24; 365/185.14
(58) Field of Classification Search ............ 365/185.17, 365/185.18, 185.22, 185.24, 185.14
    See application file for complete search history.

(56) References Cited

U.S. PATENT DOCUMENTS

| | | | | |
|---|---|---|---|---|
| 5,801,985 A * | 9/1998 | Roohparvar et al. | ... | 365/185.01 |
| 6,262,926 B1 * | 7/2001 | Nakai | .......................... | 365/200 |
| 6,400,603 B1 * | 6/2002 | Blyth et al. | ............. | 365/185.12 |
| 6,411,548 B1 * | 6/2002 | Sakui et al. | ............. | 365/185.17 |
| 6,603,680 B2 * | 8/2003 | Kanamitsu et al. | ..... | 365/185.03 |
| 6,888,758 B1 * | 5/2005 | Hemink et al. | ......... | 365/185.22 |
| 7,009,881 B2 * | 3/2006 | Noguchi | ................ | 365/185.17 |
| 7,193,893 B2 | 3/2007 | Forbes | | |
| 7,294,882 B2 * | 11/2007 | Hemink et al. | .............. | 257/315 |
| 7,295,478 B2 * | 11/2007 | Wan et al. | .................... | 365/195 |
| 7,495,963 B2 * | 2/2009 | Edahiro et al. | ......... | 365/185.21 |

FOREIGN PATENT DOCUMENTS

| | | |
|---|---|---|
| JP | 10-144085 | 5/1998 |
| JP | 2005-011521 | 1/2005 |

\* cited by examiner

*Primary Examiner*—Viet Q Nguyen
(74) *Attorney, Agent, or Firm*—Rader, Fishman & Grauer PLLC

(57) ABSTRACT

Disclosed herein is a nonvolatile semiconductor memory device including: a first selection transistor configured to be connected to a bit line; a second selection transistor configured to be connected to a common source line; a memory cell configured to be connected in series between the first and second selection transistors; and writing means for carrying out writing for a selected memory cell. In the nonvolatile semiconductor memory device, the writing means applies a potential yielding a writing-blocked state via a bit line to a memory cell for which writing is not to be carried out, of a memory cell selected for writing, and the writing means carries out writing for a writing-target memory cell in a state in which a bit line has a bit line potential state dependent upon a threshold value state of the writing-target memory cell.

18 Claims, 23 Drawing Sheets

MEMORY CELL

SELECTION TRANSISTOR

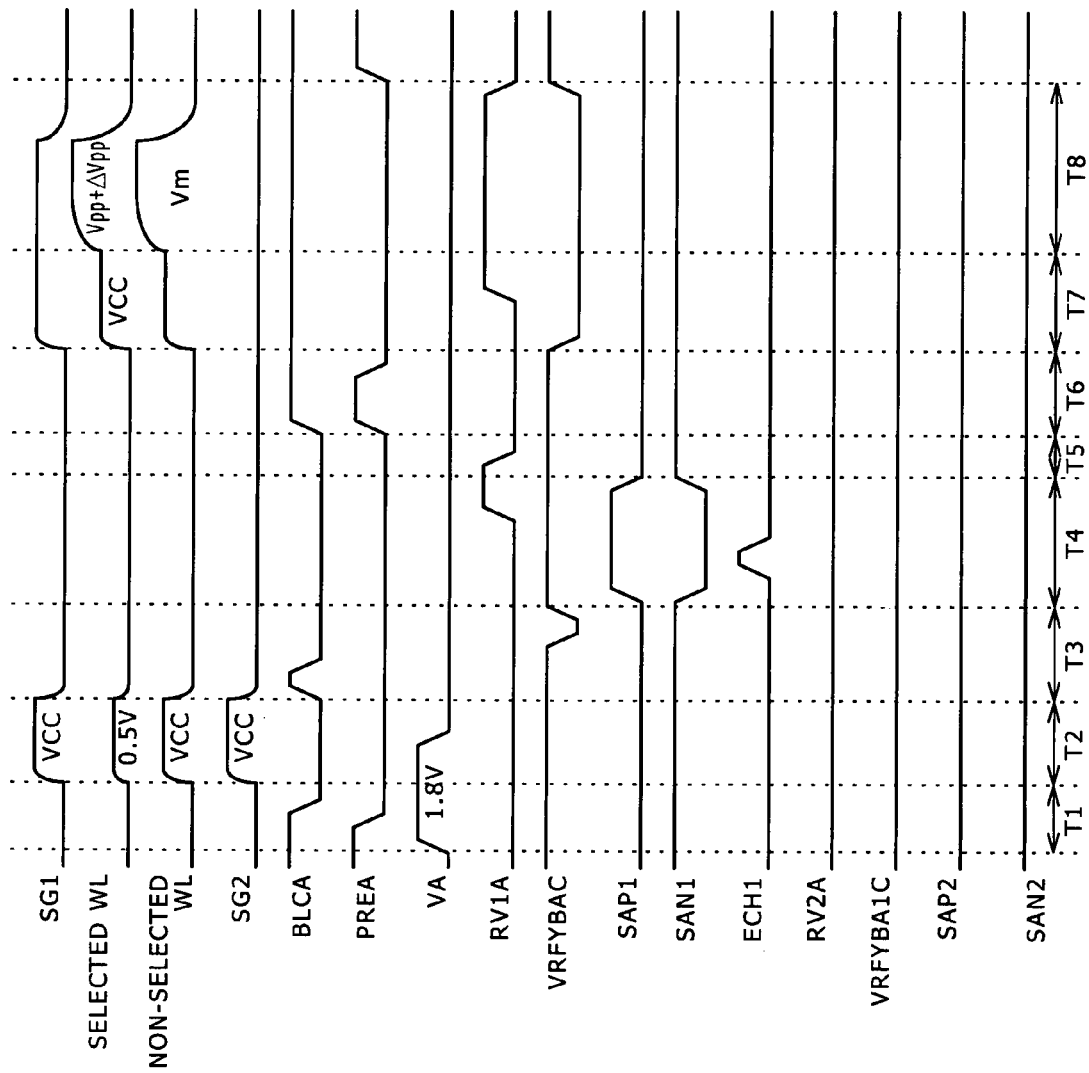

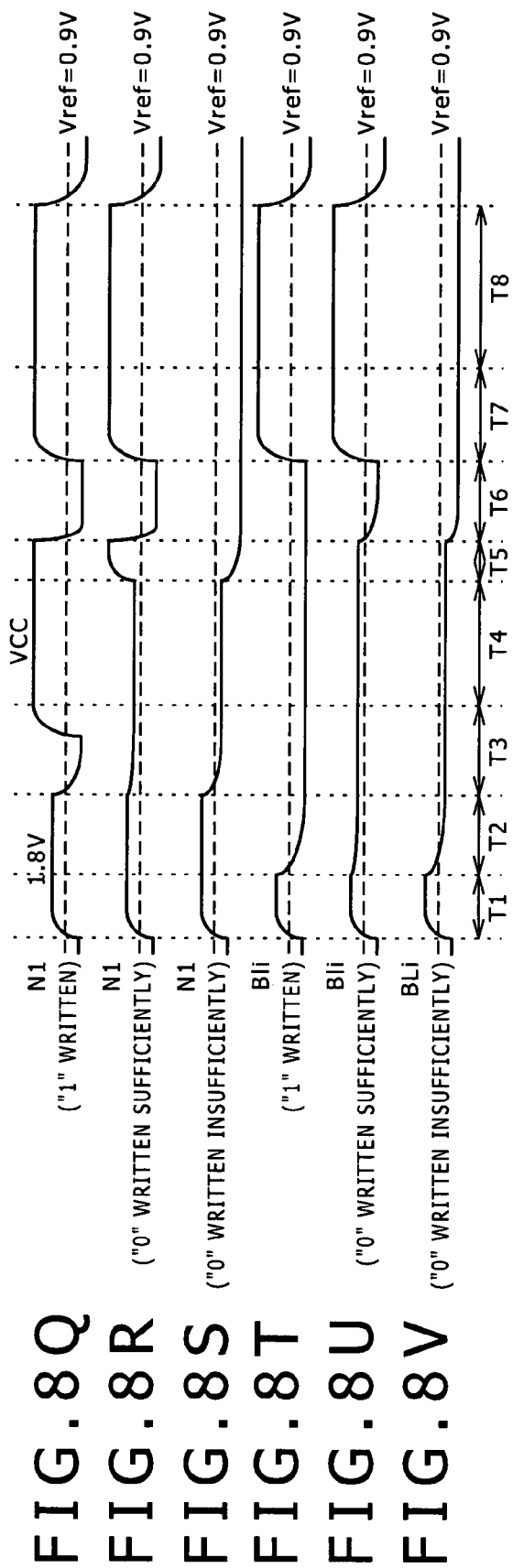

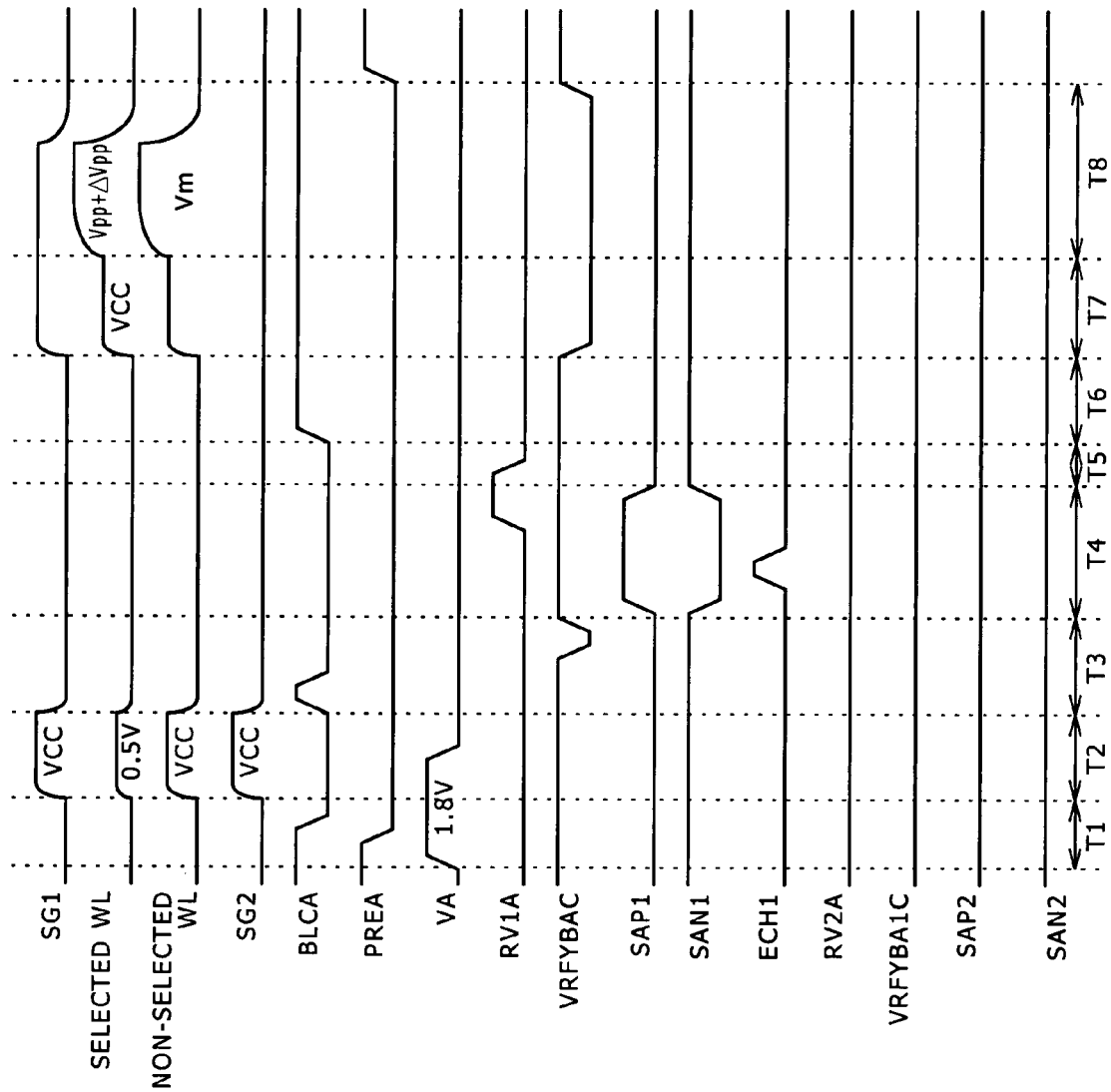

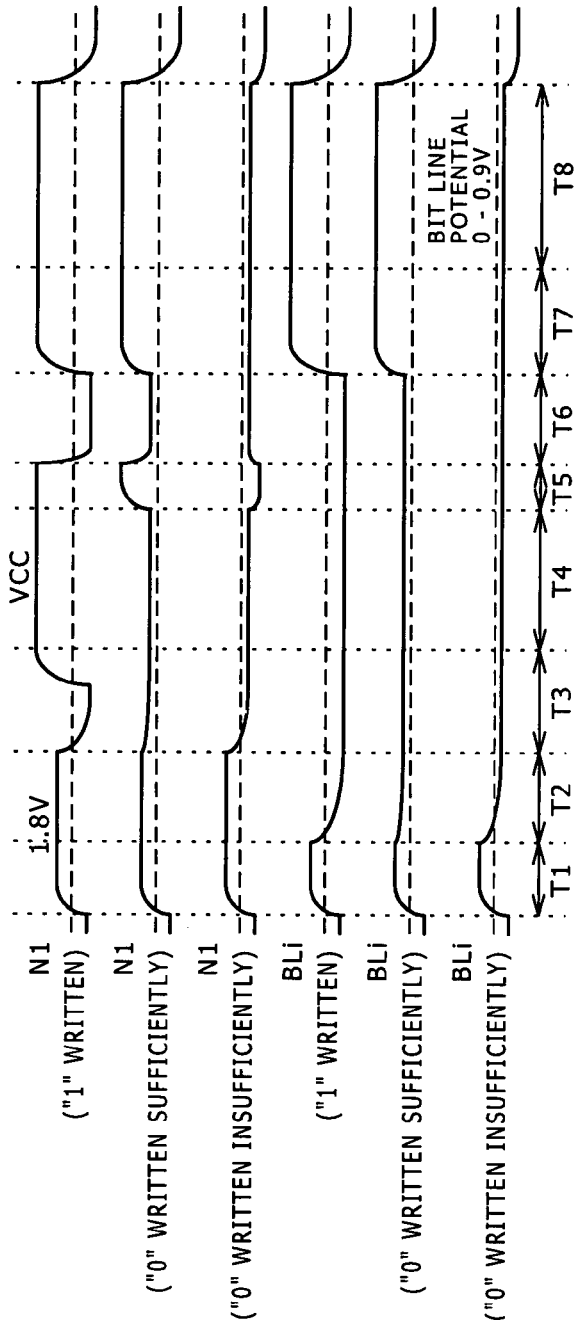

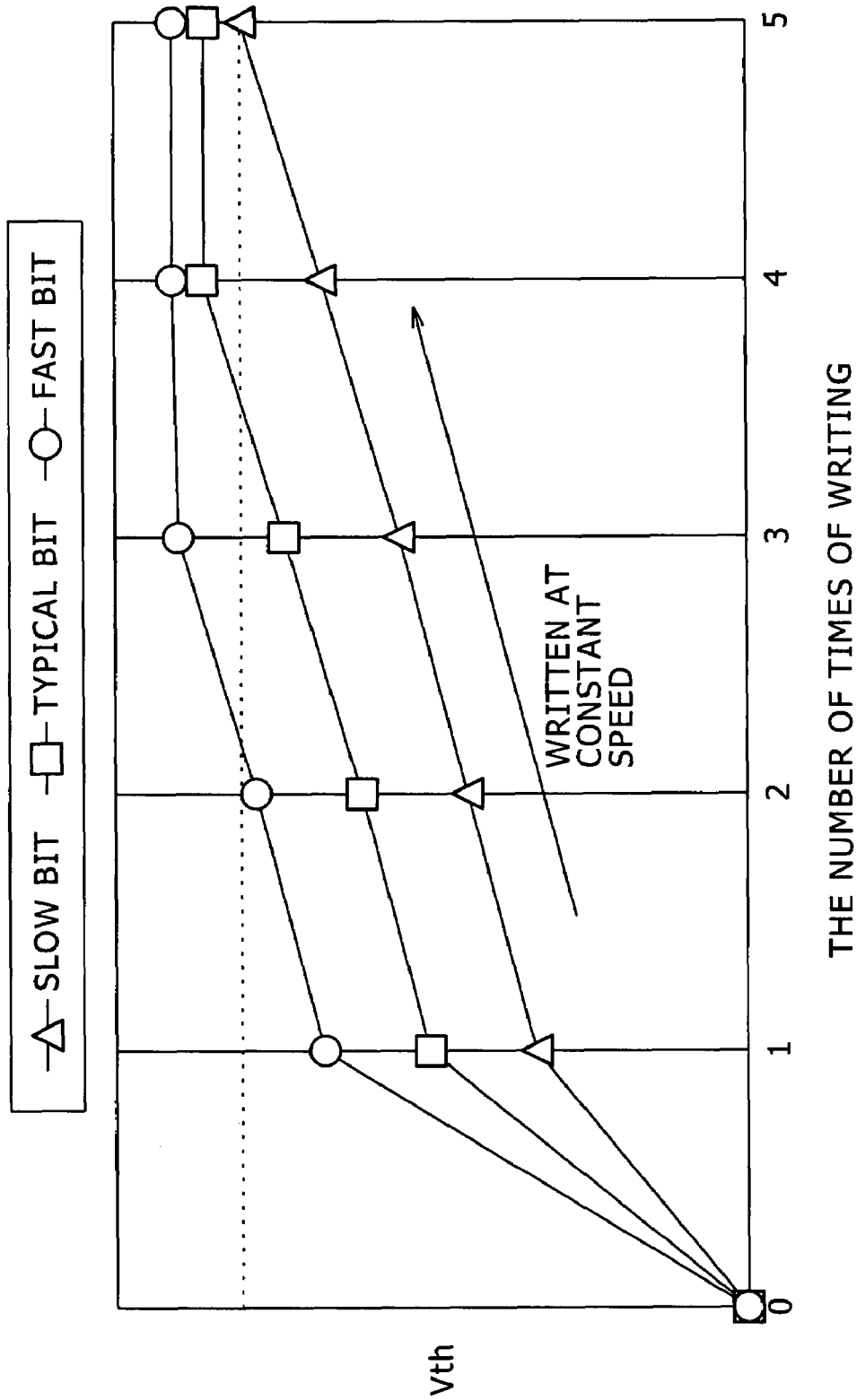

Vbl(1)

Vbl(2)

Vbl(3)

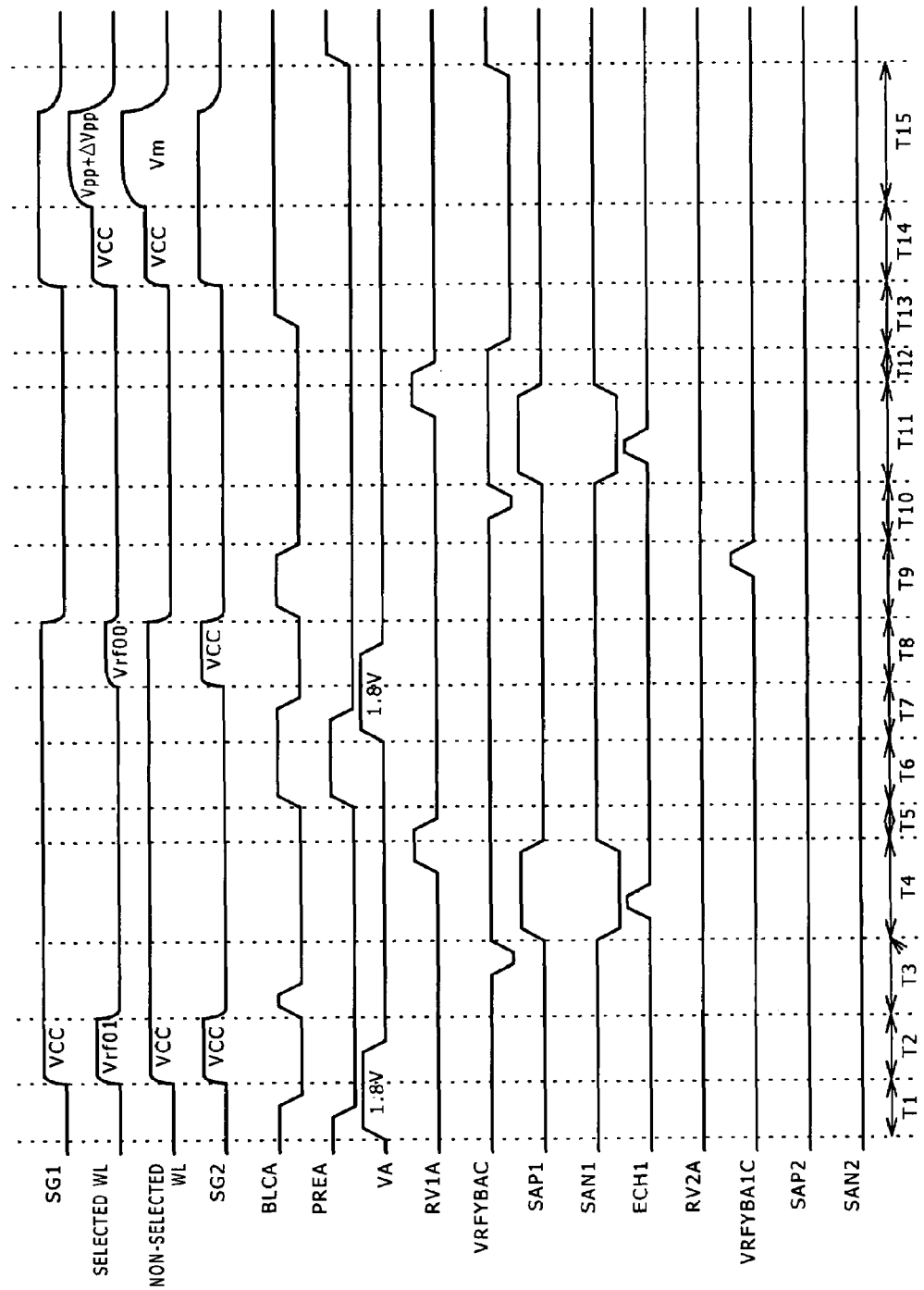

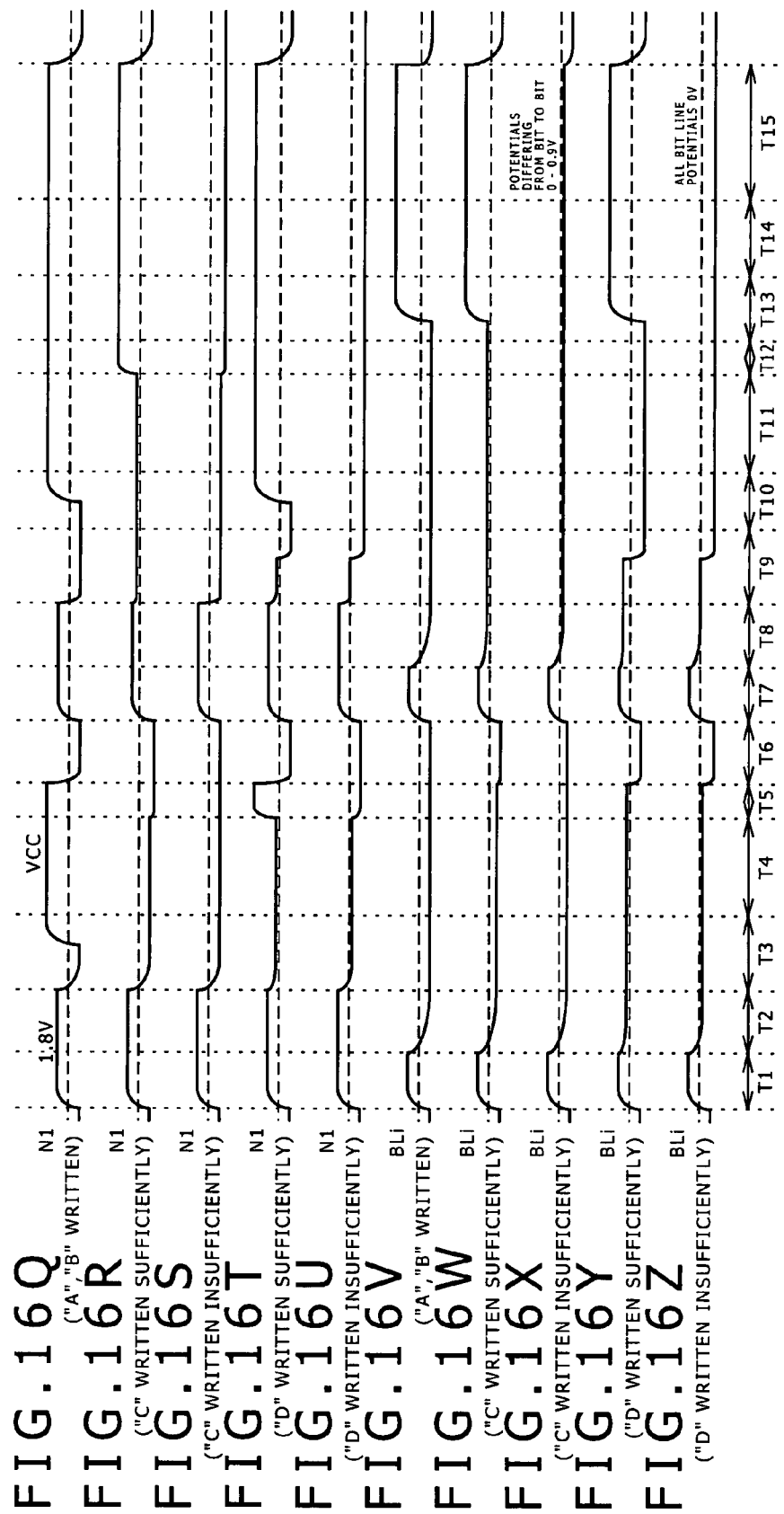

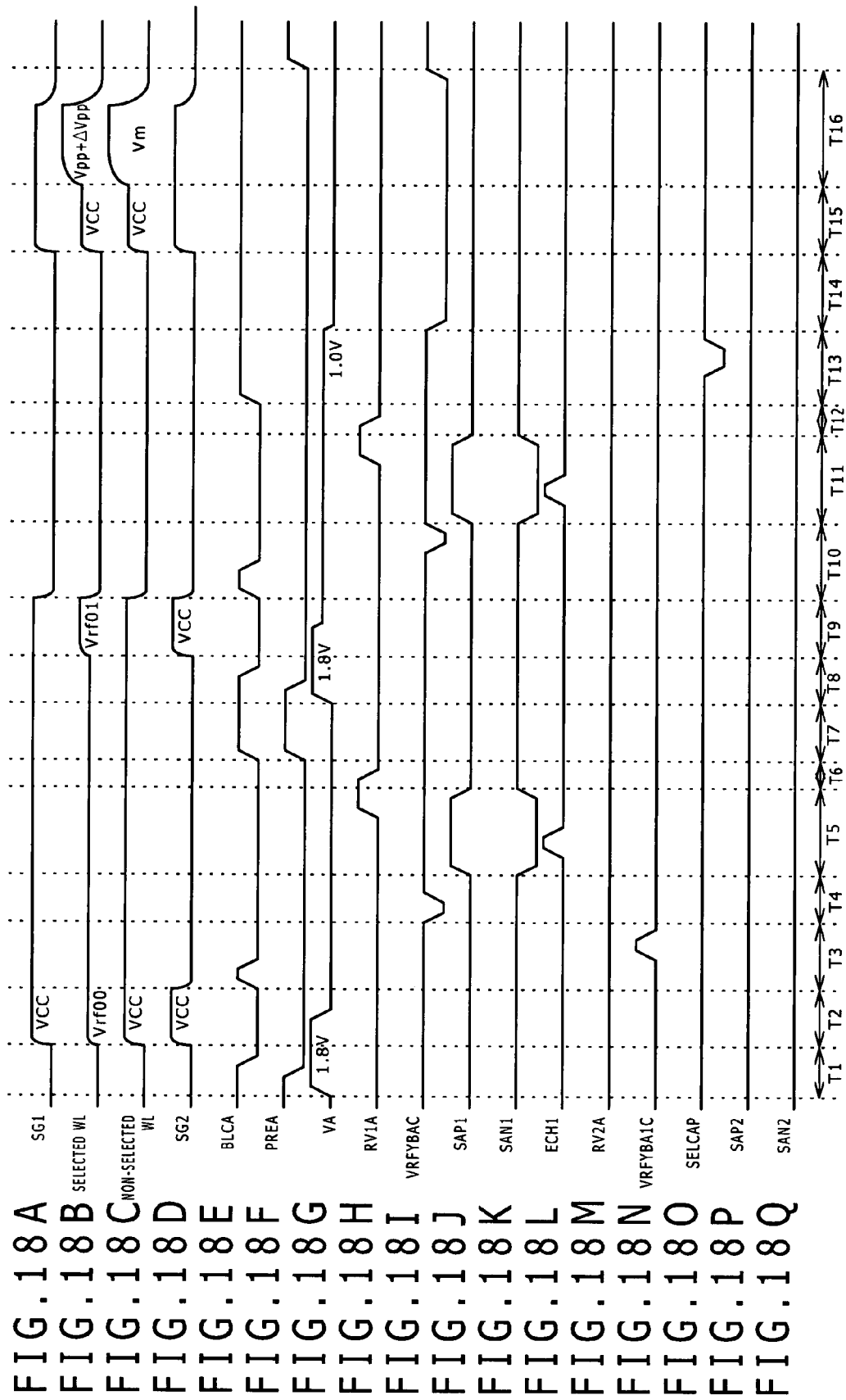

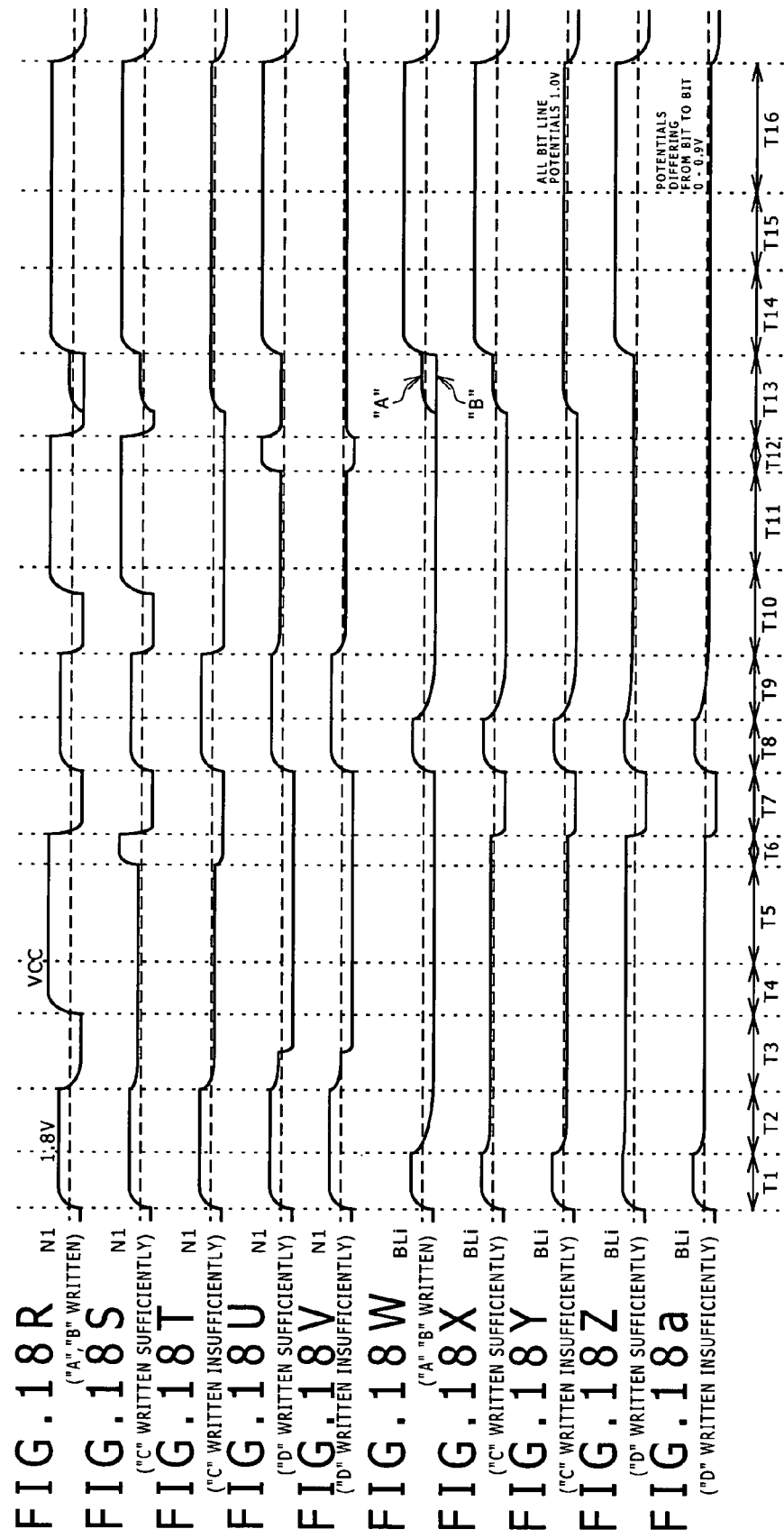

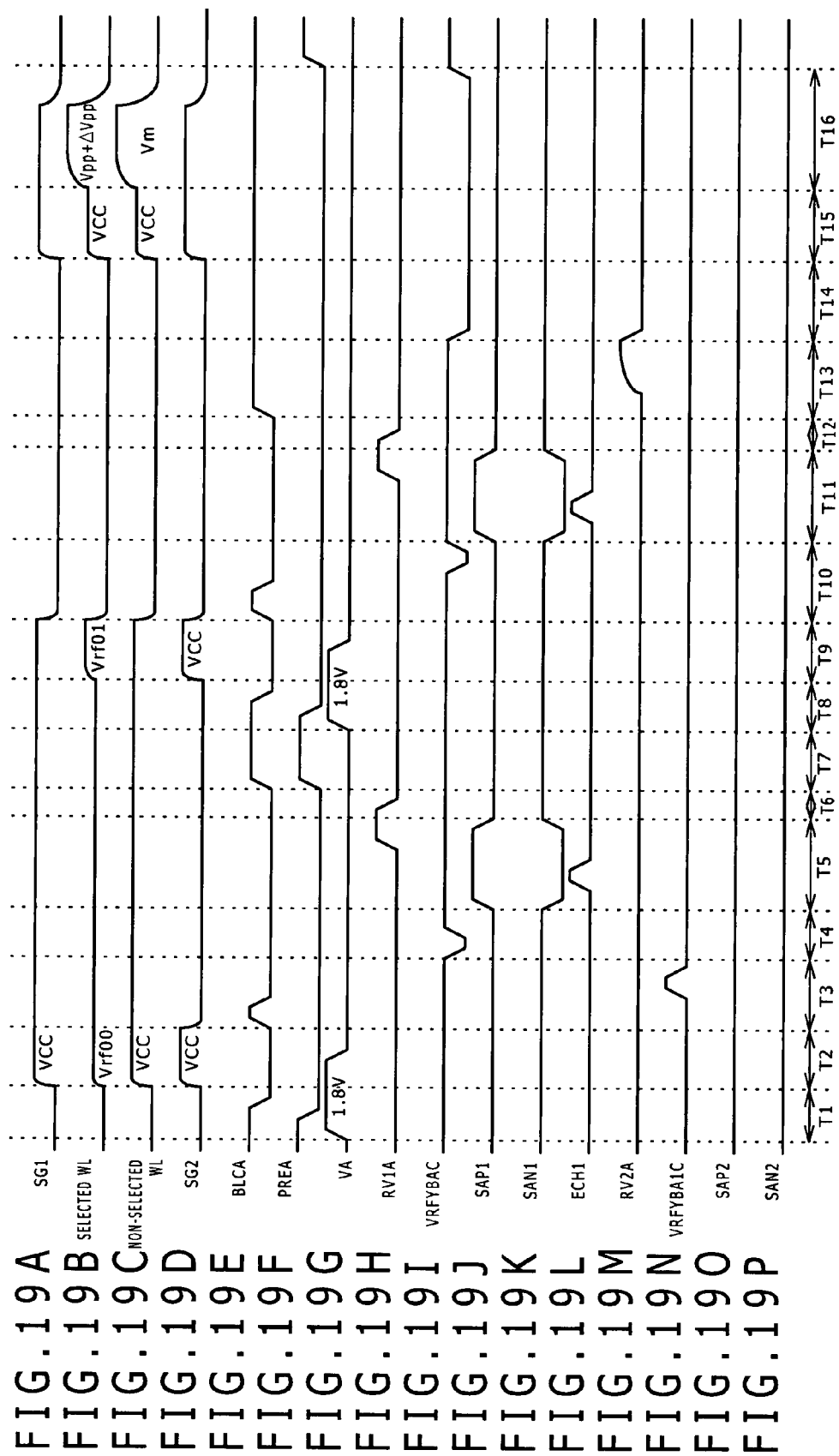

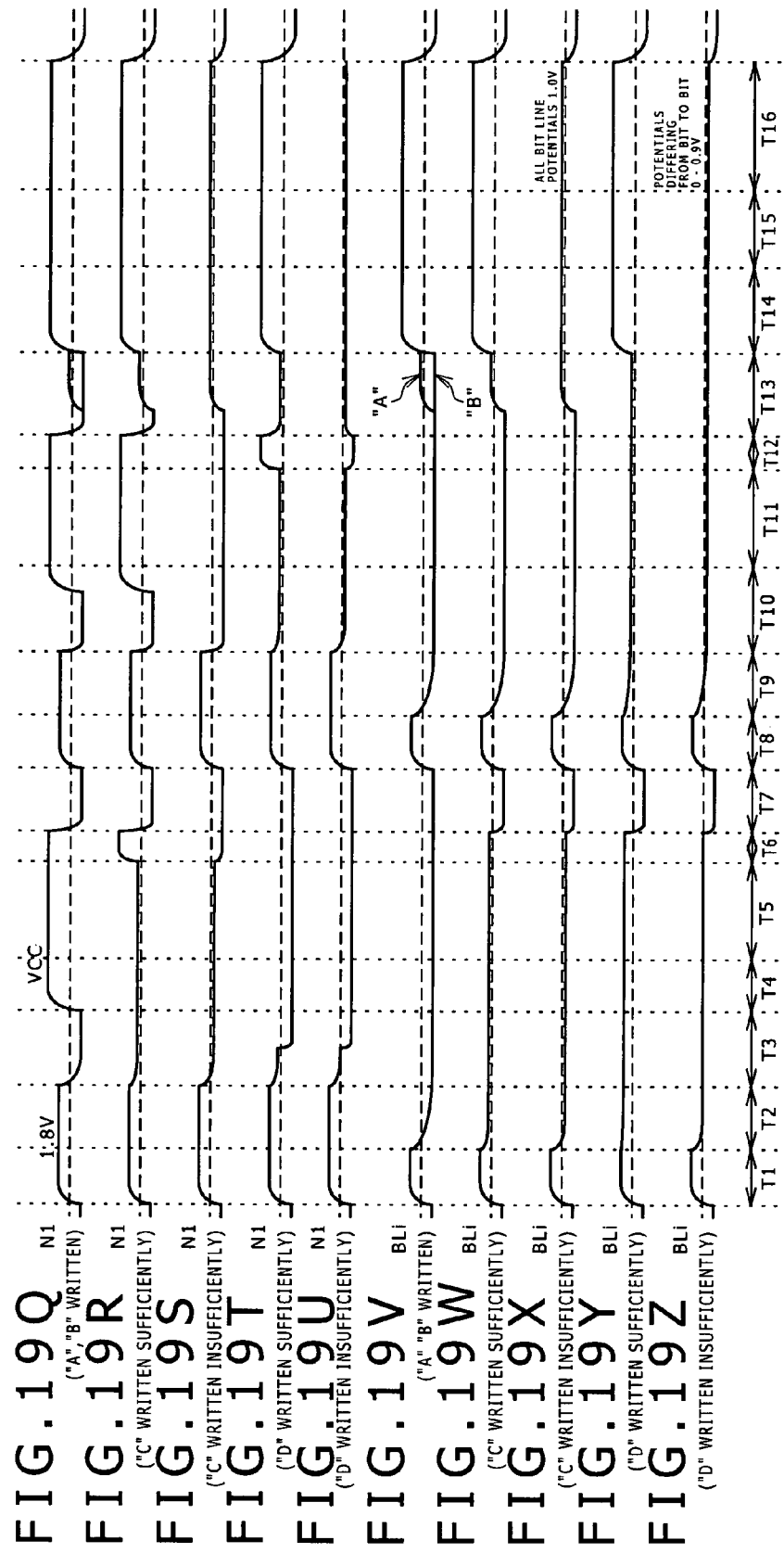

NONVOLATILE SEMICONDUCTOR MEMORY DEVICE AND WRITING METHOD THEREOF

CROSS REFERENCES TO RELATED APPLICATIONS

The present invention contains subject matter related to Japanese Patent Application JP 2006-240102 filed in the Japan Patent Office on Sep. 5, 2006, the entire contents of which being incorporated herein by reference.

BACKGROUND OF THE INVENTION

1. Field of the Invention

The present invention relates to a nonvolatile semiconductor memory device such as a NAND EEPROM, and particularly to a nonvolatile semiconductor memory device employed as a binary or multiple-valued flash memory executing high-speed writing and a writing method thereof.

2. Description of the Related Art

As one kind of EEPROM, a NAND EEPROM allowing a high integration degree is known.

For formation of the NAND EEPROM, NAND cell units are formed by connecting plural memory cells in series to each other in such a way that the source and drain are shared by adjacent memory cells, and these NAND cell units are connected to bit lines with each NAND cell unit defined as one unit.

Typically the memory cell has an FETMOS structure in which a floating gate (charge accumulation layer) and a control gate are stacked over one another. A memory cell array is formed through integration in a p-type well formed in a p-type substrate or n-type substrate.

The drain side of a NAND cell unit is connected to a bit line via a selection gate, and the source side thereof is connected to a common source line via a selection gate.

The control gates of memory cells are continuously arranged along the row direction so as to serve as a word line.

This NAND-cell-unit EEPROM operates in the following manner.

Data writing is sequentially carried out from the memory cell most remote to the bit line. A high voltage Vpp (=about 20 V) is applied to the control gate of a selected memory cell, and thereby an intermediate voltage Vm (=about 10 V) is applied to the control gate of the memory cell and the selection gate on the bit line side. Furthermore, depending on data, 0 V or a voltage VCC that cuts off the selection gate (=about 3 V) is applied to the bit line.

When 0 V is applied to the bit line, this potential is transferred to the drain of the selected memory cell so that electron injection into the charge accumulation layer arises. This shifts the threshold value of the selected memory cell in the positive direction. This state is defined as "0".

When the voltage VCC is given to the bit line, the electron injection does not arise effectively, and hence the threshold value does not change but remains at a negative value.

This state is equivalent to the erased state and defined as "1". The data writing is simultaneously carried out for memory cells sharing a control gate in parallel.

Data erasing is simultaneously carried out for all the memory cells in a NAND cell unit. Specifically, all the control gates are supplied with 0 V, and the p-type well is supplied with 20 V. At this time, the selection gates, bit line, and source line are also supplied with 20 V.

Thus, in all the memory cells, electrons in the charge accumulation layer are discharged to the p-type well so that the threshold value shifts in the negative direction.

For data reading, the control gate of the selected memory cell is supplied with 0 V, while the control gates of the other memory cells and the selection gates are given a supply voltage Vread (e.g., 5 V). In this state, whether or not a current that flows through the selected memory cell is detected the data reading is carried out.

Because of the limitation on the read operation, the threshold value obtained after the writing of "0" needs to be set to a value between 0 V and the voltage Vread. Therefore, write verify is carried out to detect memory cells to which "0" is insufficiently written, and rewriting data is set so that rewriting can be carried out only for the memory cells to which "0" is insufficiently written (bit-by-bit verify).

The memory cell to which "0" is insufficiently written is detected through reading (verify reading) in which the selected control gate is supplied with e.g. 0.5 V (verify voltage). Specifically, unless the threshold value of the memory cell is equal to or larger than 0.5 V, which is employed in consideration of a margin with respect to 0 V, a current flows through the selected memory cell so that insufficiency of writing of "0" thereto is detected.

Data writing is carried out through repetition of the write operation and write verify, and thereby, the write time is optimized for each memory cell so that the threshold value obtained after writing of "0" is adjusted to a value between 0 V and the voltage Vread.

In such a NAND-cell-unit EEPROM, if the write voltage Vpp at the time of writing is kept constant, the change of the threshold value of a memory cell is fast in the early phase of the writing, in which the amount of electrons in the charge accumulation layer is comparatively small, while the change of the threshold value of the memory cell is slow in the late phase of the writing, in which electrons have been injected to some extent and hence the amount of electrons in the charge accumulation layer is comparatively large. Furthermore, an electric field applied to an insulating film through which a tunnel current flows is strong in the writing early phase, while the electric field becomes weaker in the writing late phase.

Therefore, if the write voltage Vpp is set higher in order to enhance the write speed, the maximum threshold value obtained after the writing becomes higher and the threshold value distribution obtained after the writing becomes wider. In addition, the electric field applied to an insulating film through which a tunnel current flows becomes stronger, which deteriorates the reliability.

In contrast, if the voltage Vpp is set lower in order to narrow the threshold value distribution obtained after the writing, the write speed becomes lower.

In order to address the above-described problems, there is proposed and typically employed a writing scheme in which adjustment for each memory cell having different write speed characteristics is achieved through a stepwise increase in a write voltage Vpp by ΔVpp after every increment in the number of times of write verify (refer to Japanese Patent Laid-Open No. 2005-11521).

SUMMARY OF THE INVENTION

However, also in this scheme of increasing the voltage Vpp in a stepwise manner, the write voltage Vpp and the increment width ΔVpp are set somewhat low for a bit in which writing is fast in order to prevent the threshold value of the bit obtained after the writing from surpassing the voltage Vread as described above. This leads to a disadvantage that it takes a long time until the optimum condition of writing to a bit in which the writing is slow.

In the above-described writing scheme, the potential state of a bit line at the time of writing is set as follows. Specifically, for a memory cell for which writing is to be carried out, the bit line is set to 0 V. In contrast, for a memory cell for which writing is not to be carried out, the bit line is set to the voltage VCC.

The write speed is adjusted through control of the potential applied to a control gate. However, when only the potential applied to a control gate is controlled, adjustment to simultaneously carry out writing at different speeds for memory cells having the same control gate may be impossible.

Therefore, an intermediate voltage between 0 V and VCC is applied to each bit line, to thereby realize the adjustment to simultaneously carry out writing at different speeds for memory cells having the same control gate.

FIGS. 1A and 1B are diagrams for explaining a method for adjusting the write speed through application of an intermediate voltage between 0 V and VCC on each bit line basis.

In FIGS. 1A and 1B, ST1 and ST2 denote a selection transistor, M0 to M3 denote a memory cell, CG denotes a control gate, and FG denotes a charge accumulation layer (floating gate).

For example, as shown in FIG. 1A, when a bias of 20 V is applied to a selected write control gate and the bit line is supplied with 0 V, an electric field equivalent to 20 V is applied to the selected memory cell.

In contrast, as shown in FIG. 1B, when the bit line is supplied with 1 V, an electric field equivalent to 19 V is applied to the selected memory cell, and thus the write speed is decreased.

This scheme is used to simultaneously write the distributions of different threshold values in a multiple-valued memory in which each memory cell has plural threshold values, and techniques thereof have been proposed (refer to Japanese Patent Laid-Open No. Hei 10-144085).

However, this invention is not to adjust the write speed for each of bits for which writing is to be carried out simultaneously, but to collectively adjust the write speed for each different distribution.

There is a need for the present invention to provide a nonvolatile semiconductor memory device that can automatically adjust the write speed for each bit in linkage with the threshold value increases in a writing process, and a writing method thereof.

According to a first embodiment of the present invention, there is provided a nonvolatile semiconductor memory device that includes a first selection transistor configured to be connected to a bit line, a second selection transistor configured to be connected to a common source line, a memory cell configured to be connected in series between the first and second selection transistors, and a writer configured to carry out writing for a selected memory cell. The writer applies a potential yielding a writing-blocked state via a bit line to a memory cell for which, of a memory cell selected for writing, writing is not to be carried out, and the writer carries out writing for a writing-target memory cell in a state in which a bit line has a bit line potential state dependent upon the threshold value state of the writing-target memory cell.

According to a second embodiment of the present invention, there is provided a writing method of a nonvolatile semiconductor memory device that includes a first selection transistor connected to a bit line, a second selection transistor connected to a common source line, and at least one memory cell connected in series between the first and second selection transistors. The method includes the step of applying a potential yielding a writing-blocked state via a bit line to a memory cell for which writing is not to be carried out, and carrying out writing for a writing-target memory cell in a state in which a bit line has a bit line potential state dependent upon the threshold value state of the writing-target memory cell.

According to the embodiments of the present invention, writing is carried out in the state in which, for each bit to which writing is simultaneously carried out, the bit line potential is held in a so-called analogous manner depending on the threshold value state of the memory cell. The history of the bit line potential state is left in the bit line through a read operation such as write verify.

If writing is carried out in this state, strong writing is obtained in the state in which the threshold value is greatly lower than a desired value allowing write verify to result in a determination of "Pass", while weak writing is obtained in the state in which the threshold value has been increased to near the desired value. Therefore, in linkage with threshold value increases in the writing process, the write speed is automatically adjusted for each of the bits. Therefore, even when the write speed is enhanced through an increase in the voltages Vpp and ΔVpp, a narrowed distribution can be obtained after the writing.

According to embodiments of the present invention, the write speed can be automatically adjusted for each bit in linkage with the threshold value increases in a writing process.

BRIEF DESCRIPTION OF THE DRAWINGS

FIGS. 8A to 8V are diagrams showing a sequence from write verify to the next writing, relating to the first writing method;

FIGS. 10A to 10V are diagrams showing a sequence from write verify to the next writing, relating to the second writing method;

FIG. 12 is a diagram showing the relationships between the number of times of writing and the threshold voltage in the first writing method;

FIGS. 16A to 16Z are diagrams showing a sequence from write verify for the upper page to the next writing in a multiple-valued memory;

FIGS. 18A to 18a are diagrams showing the sequence of write verify for the upper page, employed when the circuit of FIG. 17 is used; and FIGS. 19A to 19Z are diagrams showing the sequence of write verify for the upper page, employed when not the circuit of FIG. 17 but the circuit of FIG. 6 is used.

DETAILED DESCRIPTION OF THE PREFERRED EMBODIMENTS

Embodiments of the present invention will be described below in association with the accompanying drawings.

Figure 1A:
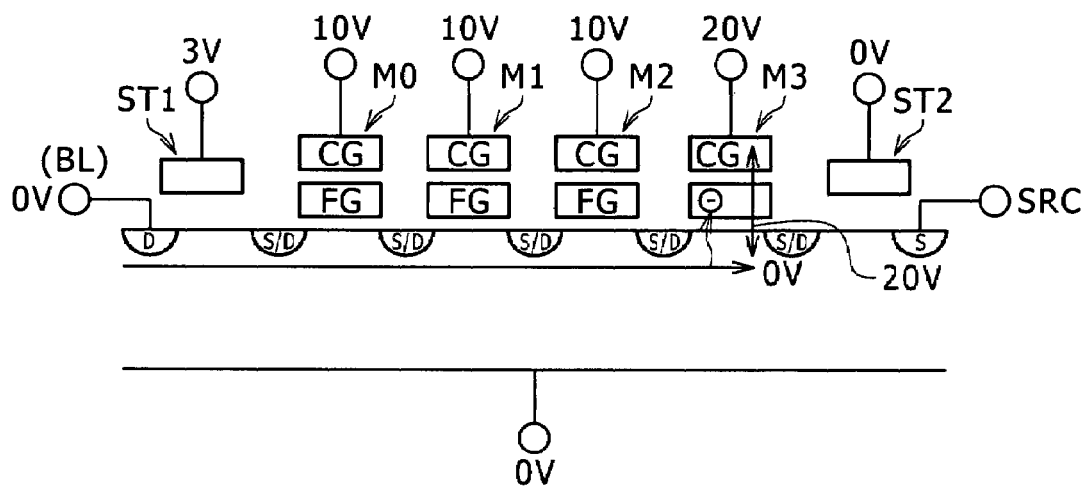
FIGS. 1A and 1B are diagrams for explaining a method for adjusting the write speed through application of an intermediate voltage between 0 V and VCC on each bit line basis.
Figure 1B:
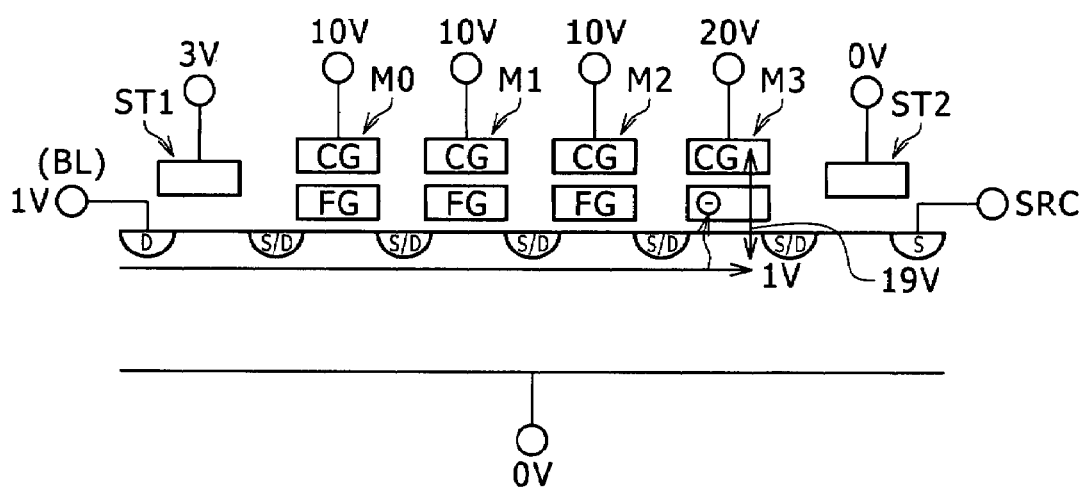
Figure 2:
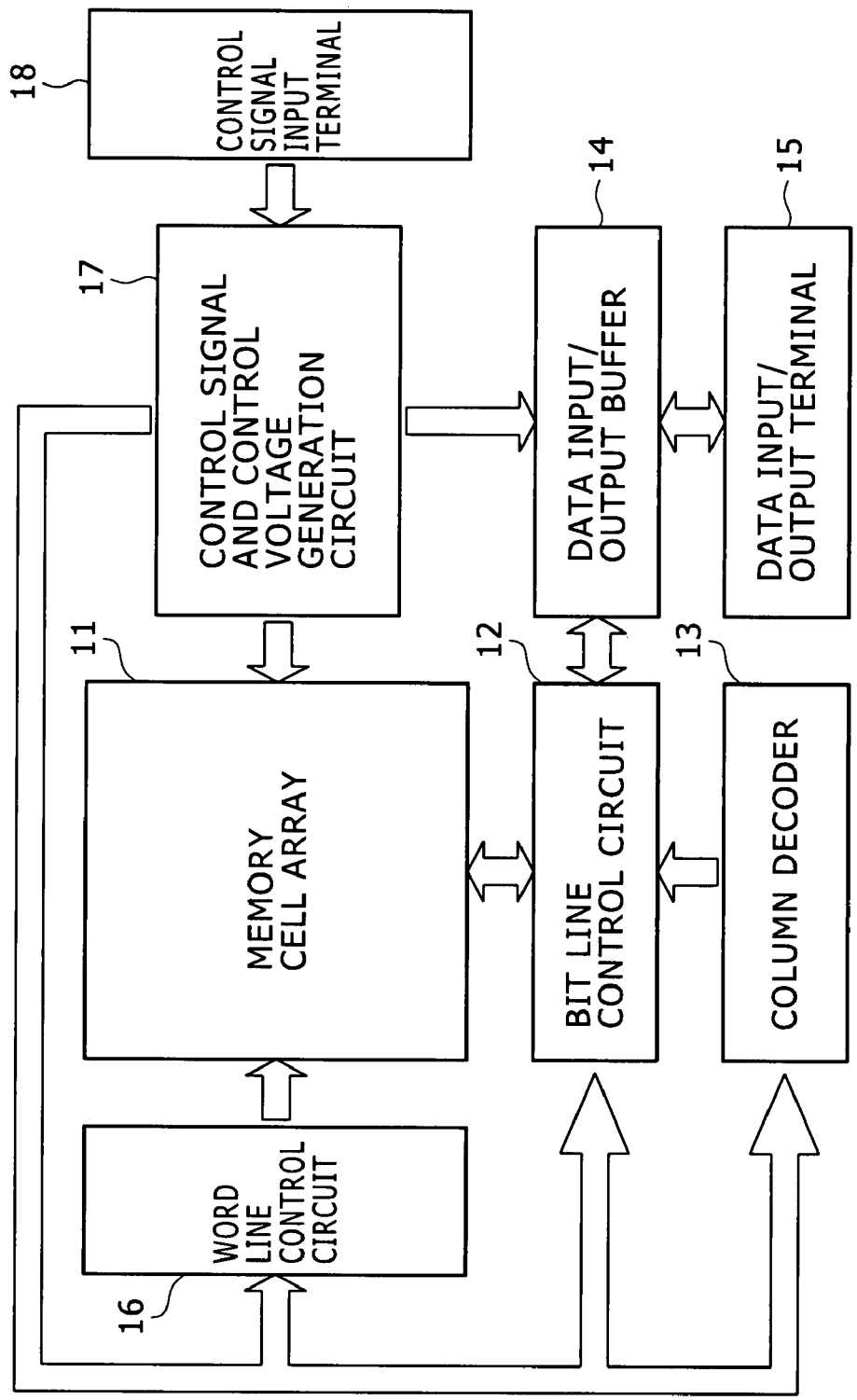
FIG. 2 is a block diagram showing a configuration example of a NAND EEPROM (flash memory) as a nonvolatile semiconductor device according to an embodiment of the present invention.

FIG. 2 is a block diagram showing a configuration example of a NAND EEPROM (flash memory) as a nonvolatile semiconductor device according to an embodiment of the present invention.

A NAND flash memory 10 includes a memory cell array 11, a bit line control circuit 12, a column decoder 13, a data input/output buffer 14, a data input/output terminal 15, a word line control circuit 16, a control signal and control voltage generation circuit 17, and a control signal input terminal 18.

The memory cell array 11 includes plural NAND memory cell units, plural bit lines, plural word lines, and a source line, as described later in detail in association with FIG. 3.

The NAND memory cell unit includes a memory cell column formed of plural memory cells connected in series to each other and selection transistors connected to both ends of the memory cell column. The source line is shared by all the memory cell units.

The bit line control circuit 12 reads out data in memory cells via bit lines in the memory cell array 11, and detects the states of memory cells via bit lines. Furthermore, the bit line control circuit 12 writes data to memory cells by applying write control voltages to the memory cells via bit lines.

The bit line control circuit 12 includes plural data memory circuits. The data memory circuit is provided for a column of the memory cell array 11. Data in memory cells read out by a data memory circuit selected by the column decoder 13 passes through the data input/output buffer 14 so as to be read out from the data input/output terminal 15 to the external.

Furthermore, data to be written input from the external to the data input/output terminal 15 passes through the data input/output buffer 14 so as to be latched as initial control data by a data memory circuit selected by the column decoder 13. The control data in the data memory circuit is used to control a write control voltage to be applied via a bit line to a selected memory cell in the memory cell array 11.

The word line control circuit 16 selects one word line from the plural word lines in the memory cell array 11, and supplies the selected one word line with a predetermined potential necessary for read operation, write operation, or erase operation.

Figure 3:
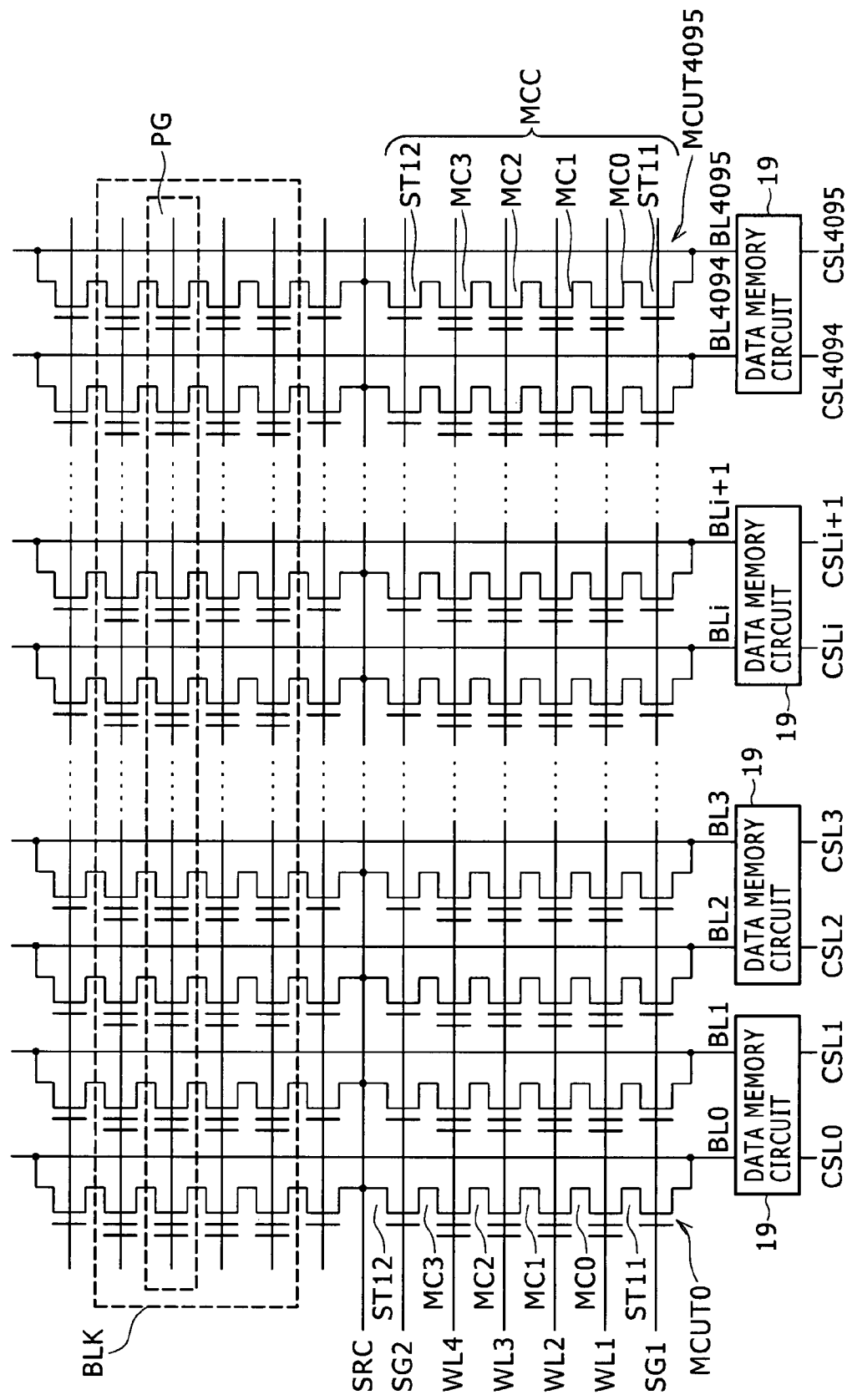
FIG. 3 is a diagram showing one example of the configuration of a memory cell array and bit line control circuits of FIG. 2.

FIG. 3 is a diagram showing one example of the configuration of the memory cell array 11 and the bit line control circuit 12 of FIG. 2.

A NAND memory cell unit MCUT includes a memory cell column MCC formed of four memory cells MC0 to MC3 connected in series to each other, a selection transistor ST11 connected between one end of the memory cell column MCC and a bit line BL, and a selection transistor ST12 connected between the other end of the memory cell column MCC and a source line SRC.

The control gate of a memory cell MC is connected to a word line WLm (m denotes a number 1 to 4). The selection transistor ST11 on the bit line side is connected to a selection gate line SG1. The selection transistor ST12 on the source line side is connected to a selection gate line SG2.

The plural memory cells MC sharing one word line WLm form a unit called a page PG. In the present example, one block BLK is composed of four pages.

Although only two blocks are shown in the present example, a practical memory cell array 11 is formed of any number of blocks (e.g., 1024 blocks). Furthermore, although the number of the bit lines is 4096 (BL0, BL1, ... BL4095) in the present example, the number may be any (e.g., 2048, 2112, or 4224).

The bit line control circuit 12 includes plural data memory circuits 19.

In the present example, one data memory circuit 19 is provided for two bit lines BLi and BLi+1 (i denotes 0 or an even number). However, one data memory circuit 19 may be provided for any number of bit lines, such as one, four, six, or nine bit lines.

Column selection signals CSL0, CSL1, ... CSL4095 are signals output from the column decoder 13. The column selection signals CSLi and CSLi+1 are input to the data memory circuit 19 connected to the bit lines BLi and BLi+1.

At the time of data reading, data in memory cells latched in the data memory circuit 19 selected by the column selection signals CSLi and CSLi+1 is led to the data input/output buffer 14 as read-out data.

Furthermore, prior to writing, based on the column selection signals CSLi and CSLi+1, control data for controlling a write control voltage to be applied to a memory cell at the time of writing is initially transferred to either one of the bit lines BLi and BLi+1.

In write-state detection, the write states of memory cells connected to either one of the bit lines BLi and BLi+1 are detected.

Figure 4:
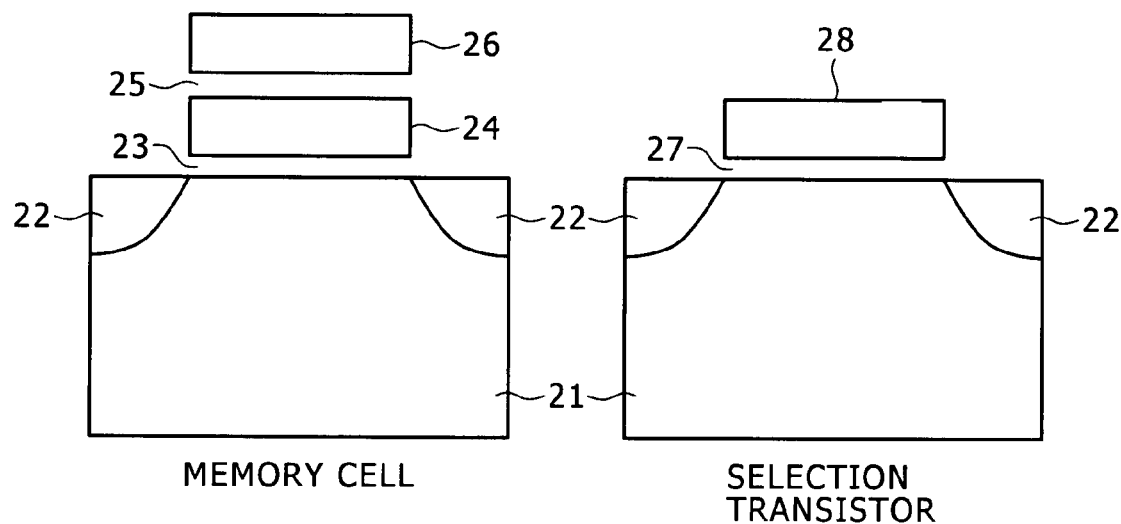
FIG. 4 is a diagram schematically showing the structures of a memory cell MC and a selection transistor ST of FIG. 3.

FIG. 4 is a diagram schematically showing the structures of the memory cell MC and the selection transistor ST of FIG. 3.

As shown in FIG. 4, on the surface side of a p-type semiconductor substrate 21, n-type diffused layers 22 each serving as a source or drain are formed.

The memory cell MC includes the n-type diffused layers 22 in the semiconductor substrate 21, a gate insulating film 23 on the semiconductor substrate 21, a floating gate 24 on the gate insulating film 23, an insulating film 25 on the floating gate 24, and a control gate (word line) 26 on the insulating film 25.

The selection transistor ST includes the n-type diffused layers 22 in the semiconductor substrate 21, a gate insulating film 27 on the semiconductor substrate 21, and a selection gate 28 on the gate insulating film 27.

When a potential equal to or higher than the threshold value of the memory cell MC is supplied to the control gate 26 of the memory cell MC, a channel is formed in the surface part of the substrate semiconductor 21 directly beneath the floating gate 24.

If it is assumed that the capacitance between the control gate 26 and the floating gate 24 is 1 fF, the capacitance between the floating gate 24 and the channel is 1 fF, the capacitance between the channel and the semiconductor substrate 21 is 0.25 fF, and the capacitance between the n-type diffused layer 22 and the semiconductor substrate 21 is 0.25 fF, the capacitance coupling ratio between the control gate 26 and the channel and the capacitance coupling ratio between the control gate 26 and the n-type diffused layer 22 are each 50%.

In this case, when the channel and the n-type diffused layer 22 are in the floating state, increase in the potential of the control gate 26 by 1 V leads to increase in the potentials of the channel and the n-type diffused layer 22 by 0.5 V.

Figure 5:
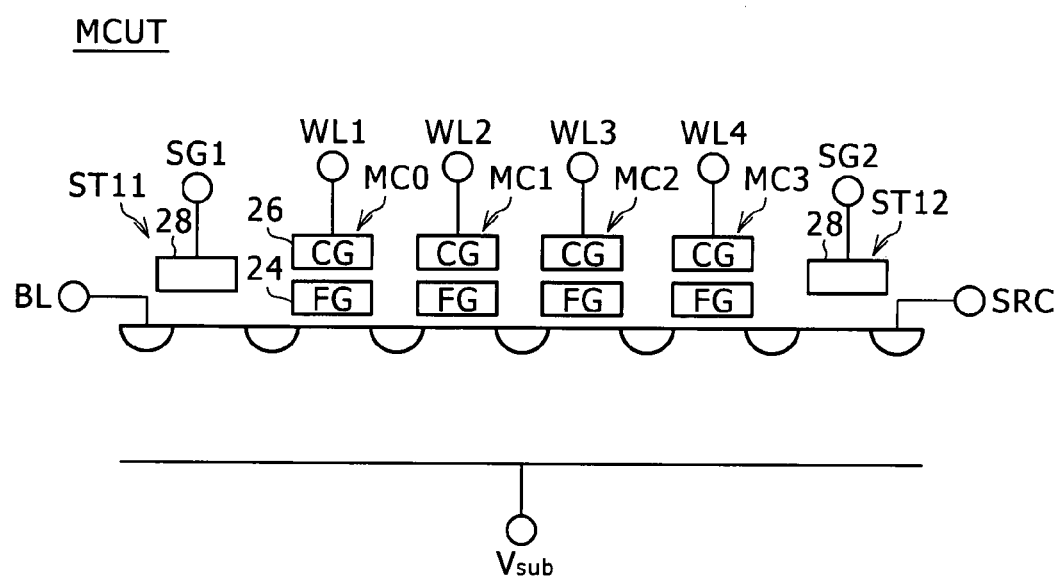
FIG. 5 is a diagram schematically showing the structure of a NAND memory cell unit MCUT of FIG. 3.

FIG. 5 is a diagram schematically showing the structure of the NAND memory cell unit of FIG. 3.

In the present embodiment, the memory cell column MCC is formed of four memory cells MC0 to MC3. One end of the memory cell column MCC is connected to the source line SRC via the selection transistor ST12. The other end of the memory cell column MCC is connected to the bit line BL via the selection transistor ST11.

Figure 6:
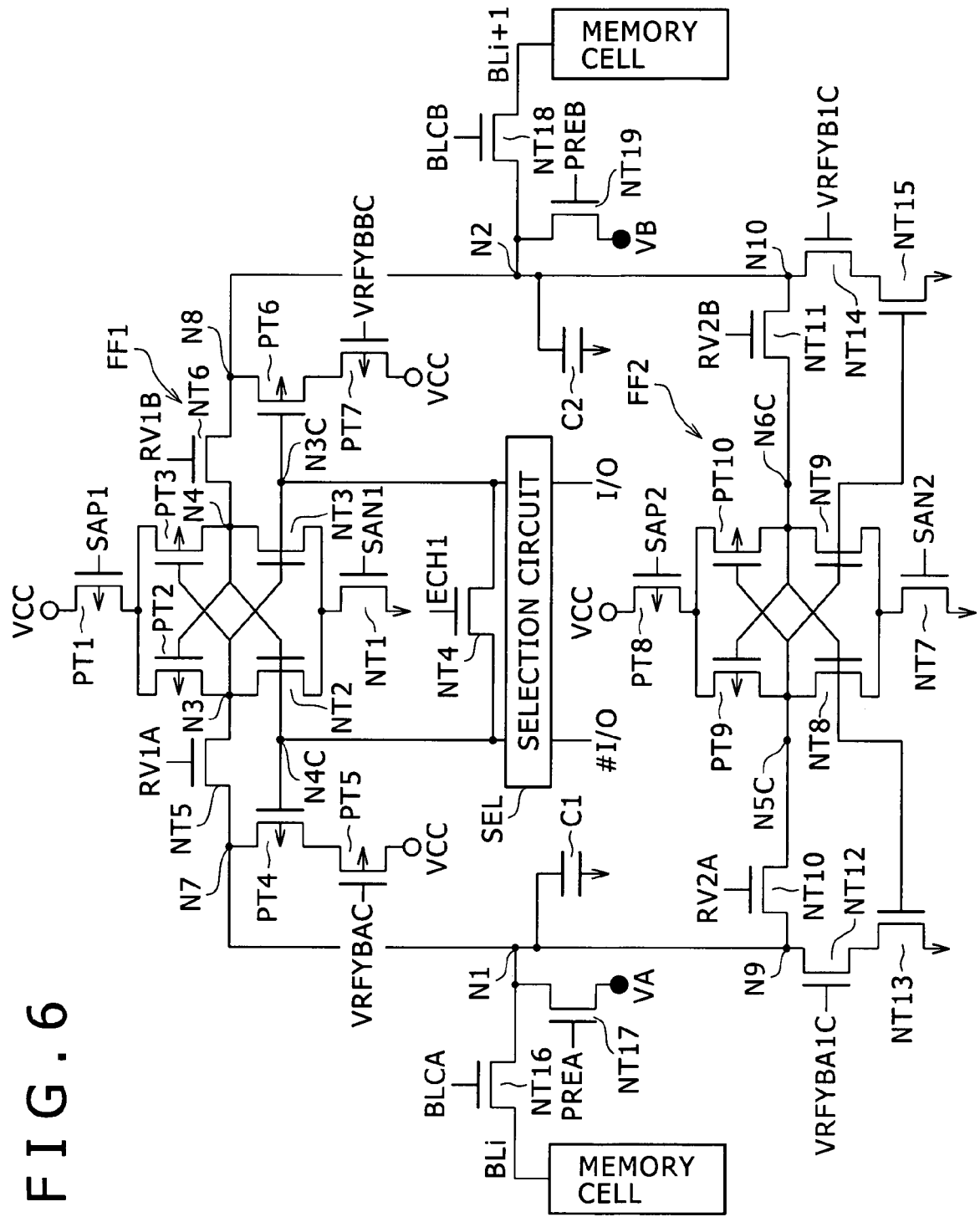
FIG. 6 is a circuit diagram showing a specific configuration example of a data memory circuit disposed in the bit line control circuit according to the embodiment.

FIG. 6 is a circuit diagram showing a specific configuration example of the data memory circuit disposed in the bit line control circuit according to the present embodiment.

The data memory circuit 19 of FIG. 6 includes p-channel MOS (PMOS) transistors PT1 to PT10, n-channel MOS (NMOS) transistors NT1 to NT19, capacitors C1 and C2, nodes N1 to N4, N3C, N4C, N5C, and N6C, and a selection circuit SEL.

The source of the PMOS transistor PT1 is connected to a supply line for the voltage VCC, and the drain thereof is connected to the sources of the PMOS transistors PT2 and PT3. The drain of the PMOS transistor PT2 is connected to the drain of the NMOS transistor NT2, and the connecting node therebetween is the node N3. The drain of the PMOS transistor PT3 is connected to the drain of the NMOS transistor NT3, and the connecting node therebetween is the node N4.

The sources of the NMOS transistors NT2 and NT3 are connected to each other, and the connecting node therebetween is connected to the drain of the NMOS transistor NT1. The source of the NMOS transistor NT1 is connected to a reference potential.

The drain of the NMOS transistor NT5 is connected to the node N3. The source thereof is connected to the node N1, and the connecting node N7 therebetween is connected to the drain of the PMOS transistor PT4. The source of the PMOS transistor PT4 is connected to the drain of the PMOS transistor PT5, and the source of the PMOS transistor PT5 is connected to a supply line for the voltage VCC.

The drain of the NMOS transistor NT6 is connected to the node N4. The source thereof is connected to the node N2, and the connecting node N8 therebetween is connected to the drain of the PMOS transistor PT6. The source of the PMOS transistor PT6 is connected to the drain of the PMOS transistor PT7, and the source of the PMOS transistor PT7 is connected to a supply line for the voltage VCC.

The nodes N4 and N4C are connected to each other via the gate of the NMOS transistor NT2. The nodes N3 and N3C are connected to each other via the gate of the NMOS transistor NT3. The source and drain of the NMOS transistor NT4 are connected between the nodes N3C and N4C.

The gate of the PMOS transistor PT1 is connected to a supply line for a signal SAP1, and the gate of the NMOS transistor NT1 is connected to a supply line for a signal SAN1. The gate of the PMOS transistor PT3, the gate of the NMOS transistor NT3, and the gate of the PMOS transistor PT6 are connected to the node N3 (N3C). The gate of the PMOS transistor PT2, the gate of the NMOS transistor NT2, and the gate of the PMOS transistor PT4 are connected to the node N4 (N4C). The gate of the NMOS transistor NT5 is connected to a supply line for a signal RV1A, and the gate of the NMOS transistor NT6 is connected to a supply line for a signal RV1B. The gate of the PMOS transistor PT5 is connected to a supply line for a signal VRFYBAC, and the gate of the PMOS transistor PT7 is connected to a supply line for a signal VRFYBBC.

The node N3C is selectively connected to a data input/output line I/O by the selection circuit SEL, and the node N4C is selectively connected to a data input/output line #I/O by the selection circuit SEL.

The source of the PMOS transistor PT8 is connected to a supply line for the voltage VCC, and the drain thereof is connected to the sources of the PMOS transistors PT9 and PT10. The drain of the PMOS transistor. PT9 is connected to the drain of the NMOS transistor NT8, and the connecting node therebetween is the node N5C. The drain of the PMOS transistor PT10 is connected to the drain of the NMOS transistor NT9, and the connecting node therebetween is the node N6C.

The sources of the NMOS transistors NT8 and NT9 are connected to each other, and the connecting node therebetween is connected to the drain of the NMOS transistor NT7. The source of the NMOS transistor NT7 is connected to the reference potential.

The drain of the NMOS transistor NT10 is connected to the node N5C. The source thereof is connected to the node N1, and the connecting node N9 therebetween is connected to the drain of the NMOS transistor NT12. The source of the NMOS transistor NT12 is connected to the drain of the NMOS transistor NT13, and the source of the NMOS transistor NT13 is connected to a supply line for the voltage VCC.

The drain of the NMOS transistor NT11 is connected to the node N6C. The source thereof is connected to the node N2, and the connecting node N10 therebetween is connected to the drain of the NMOS transistor NT14. The source of the NMOS transistor NT14 is connected to the drain of the NMOS transistor NT15, and the source of the NMOS transistor NT15 is connected to a supply line for the voltage VCC.

The gate of the PMOS transistor PT8 is connected to a supply line for a signal SAP2, and the gate of the NMOS transistor NT7 is connected to a supply line for a signal SAN2. The gate of the PMOS transistor PT10, the gate of the NMOS transistor NT9, and the gate of the NMOS transistor NT15 are connected to the node N5C. The gate of the PMOS transistor PT9, the gate of the NMOS transistor NT8, and the gate of the NMOS transistor NT13 are connected to the node N6C. The gate of the NMOS transistor NT10 is connected to a supply line for a signal RV2A, and the gate of the NMOS transistor NT11 is connected to a supply line for a signal RV2B. The gate of the NMOS transistor NT12 is connected to a supply line for a signal VRFYBA1C, and the gate of the NMOS transistor NT14 is connected to a supply line for a signal VRFYB1C.

The source of the NMOS transistor NT16 is connected to the bit line BLi, and the drain thereof is connected to the node N1. The drain of the NMOS transistor NT17 is connected to the node N1, and the source thereof is connected to a supply line for a voltage VA.

The source of the NMOS transistor NT18 is connected to the bit line BLi+1, and the drain thereof is connected to the node N2. The drain of the NMOS transistor NT19 is connected to the node N2, and the source thereof is connected to a supply line for a voltage VB.

The gate of the NMOS transistor NT16 is connected to a supply line for a signal BLCA, and the gate of the NMOS transistor NT17 is connected to a supply line for a signal PREA. The gate of the NMOS transistor NT18 is connected to a supply line for a signal BLCB, and the gate of the NMOS transistor NT19 is connected to a supply line for a signal PREB.

The capacitor C1 is connected to the node N1, and the capacitor C2 is connected to the node N2.

In the data memory circuit having such a configuration, a latch circuit FF1 is formed by the PMOS transistors PT1 to PT7, the NMOS transistors NT1 to NT6, and the selection circuit SEL.

In addition, a latch circuit FF2 that can function as a cache register is formed by the PMOS transistors PT8 to PT10, and the NMOS transistors NT7 to NT15.

Write operation by use of the data memory circuit 19 having the configuration of FIG. 6 will be described below.

Figure 7:
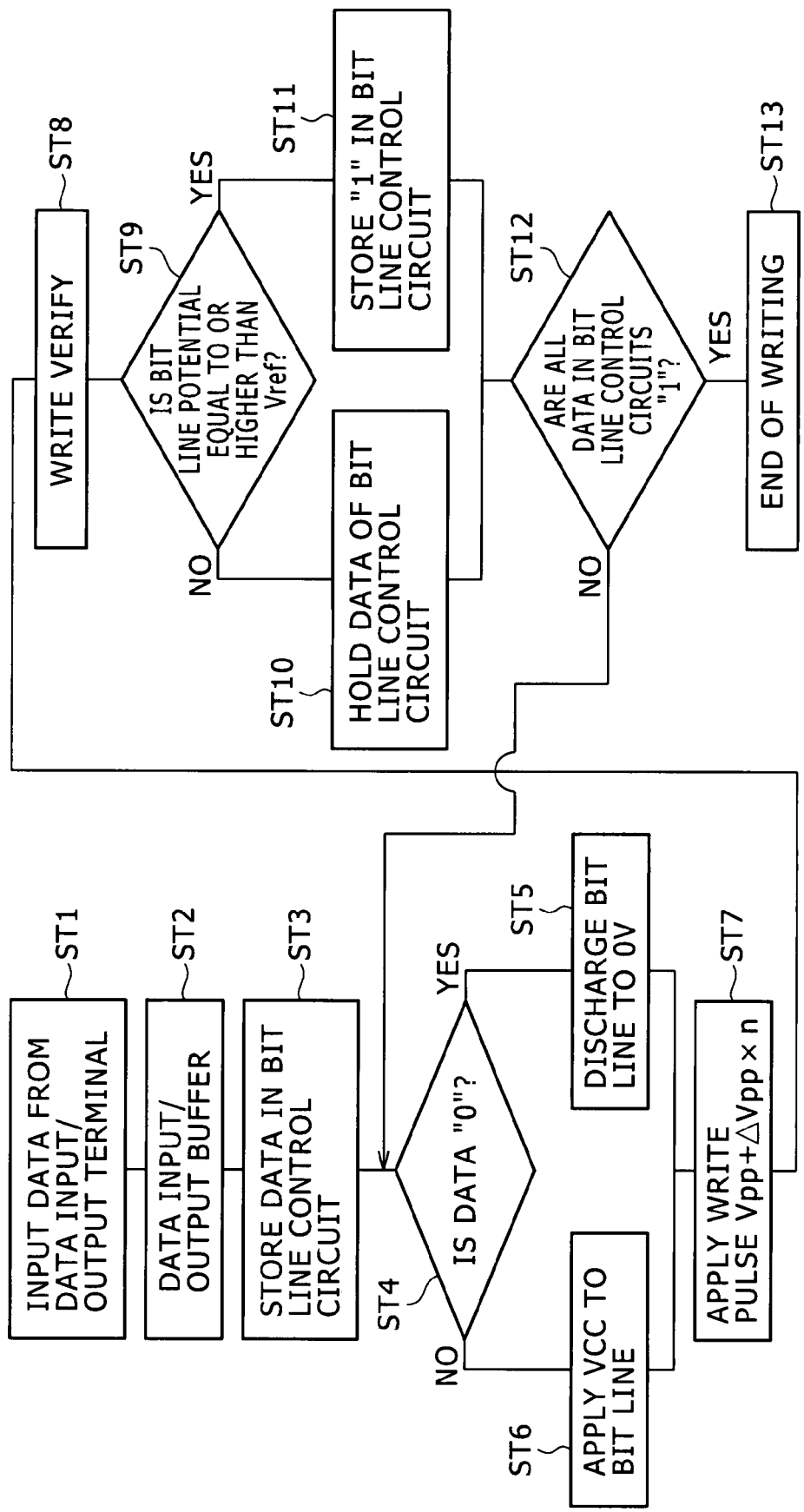
FIG. 7 is a flowchart for explaining a first writing method.

FIG. 7 is a flowchart for explaining a first writing method. FIGS. 8A to 8V are diagrams showing a sequence from write verify to the next writing, relating to the first writing method.

In writing of binary data, only the latch circuit FF1 in FIG. 6 is used for reading and writing. In the case of binary data, the latch circuit FF2 is used mainly as a cache register. In the following, the case where an even-numbered bit line (BLi) is selected will be described.

Initially, from the data input/output terminal 15, binary data of "0" or "1" are input in units of a predetermined data amount (in this example, 512 bytes) (ST1). The data pass through the data input/output buffer 14 (ST2), and are stored in the latch circuit FF1 via the write data input/output lines I/O and #I/O (ST3).

If the input data is "0", the node N4C in FIG. 6 is turned to "H (high level)", while the node N3C is turned to "L (low level)" (ST4, ST5).

In contrast, if the input data is "1", the nodes NC4 and NC3 are turned to the opposite levels. That is, the node N4C is turned to "L", while the node N3C is turned to "H" (ST4, ST6).

Initially, the voltage VA is set to 0 V, and the signals PREA and BLCA are turned to "H", to thereby fix the potentials of all the bit lines BL at 0 V (ST5).

Thereafter, the signal PREA is turned to "L", and the signal VRFYBAC is turned to "L". Due to this operation, the bit line of data "0", which is a writing target, is fixed at 0 V without change. In contrast, the bit line of data "1", which is not a writing target, is supplied with the voltage VCC because the node N4C is at "L".

In this state, a write pulse Vpp is applied to the word line WL corresponding to the writing-target page (ST7). At this time, writing is carried out for the bit of data "0" because the bit line potential is 0 V. In contrast, the bit line potential of the bit of data "1" is VCC. Therefore, the channel potential of the memory cell is boosted and thus writing thereto is not carried out.

After the writing, write verify is carried out to detect whether or not the writing has been advanced to a desired threshold value (ST8).

In the write verify, initially the signals PREA and BLCA are turned to VCC, and the voltage VA is set to 1.8 V. This operation precharges the potentials of all the bit lines to 1.8 V (T1 of FIG. 8). A write verify voltage (about 0.5 V) is applied to the selected word line WL corresponding to the writing-target page, while the voltage VCC is applied to the non-selected word lines WL.

If the voltage VCC is applied to the selection gate lines SG1 and SG2 in this state, a memory cell current dependent upon the threshold value of the memory cell of the writing-target page flows from the bit line to the common source line SRC via the serially-connected memory cells. In response to this current flow, the potential of the bit line decreases transiently.

After the current flow during a certain period, the potentials of the word lines WL and the selection gate lines SG1 and SG2 of the target block are turned to 0 V to thereby cut off the current. Due to this operation, charges dependent upon the threshold value of the memory cell are left in the bit line, and the potential thereof is kept by the capacitance of the bit line (T2 of FIG. 8).

Subsequently, the signal BLCA is turned to "H" so that the potential of the bit line may be charge-shared with the node N1, and then the node N1 is isolated from the node of the bit line BL (the signal BLCA is turned to "L"). This operation allows the data to be held by the capacitor C1 connected to the node N1.

Because the capacitance of the capacitor C1 connected to the node N1 is sufficiently lower than that of the bit line BL, the potential of the node N1 becomes substantially equal to that of the bit line BL.

Thereafter, when the signal VRFYBAC is turned to "L", the node N1 in the latch circuit FF1 in which data "1" is originally stored, i.e., the node N1 of the bit that is not selected for writing, is fixed at VCC (T3 of FIG. 8).

Thereafter, the signal VRFYBAC is returned to "H", and the signals SAP1, SAN1, and ECH1 are turned to "H", "L", and "H", respectively, to thereby equalize the nodes N3C and N4C. This clears the data in the latch circuit FF1. Subsequently, upon turning the signal RV1A to "H", sensing is started (T4 of FIG. 8).

After sensing for a certain period, the signals SAP1 and SAN1 are turned to "L" and "H", respectively so that the latch data of the latch circuit FF1 is determined and stored (T5 of FIG. 8).

If at this time the potential of the node N1 is equal to or higher than Vref (e.g., 0.9 V), the writing has been sufficiently carried out. Therefore, the write verify results in a determination of "Pass", and the node N4C in the latch circuit FF1 is turned to "L" so that data "1" is stored therein.

In contrast, if the potential of the node N1 is lower than Vref, the writing is insufficient. Therefore, the write verify results in a determination of "Fail", and the node N4C in the latch circuit FF1 is kept at "H" so that data "0" is stored therein. At this time, of the latches in which data "1" has been stored, in all the bit line control circuits 12, only the latches in which data "1" is originally stored and those for which it has been determined through the verify that the bit line potential is equal to or higher than Vref (ST9, ST10, ST11).

That is, the bit of which latch circuit FF1 stores therein data "0" demands rewriting due to insufficient writing. If all the latch circuits FF1 have been given data "1" (ST12), the writing is ended (ST13). If not so, the sequence is returned to the writing processing from the step ST4 again.

In the rewriting, the voltage VA is kept at 0 V, and the signals BLCA and PREA are turned to "H", to thereby ground all the bit lines (T6 of FIG. 8).

Subsequently, the voltage VCC is charged to the bit lines for which the write verify has resulted in "Pass" and the bit lines of the distribution of "1". In contrast, the bit line for which data "0" is stored, i.e., the bit line for which the previous verify has resulted in "Fail" because of insufficiency of writing, is set to 0 V (T7 of FIG. 8).

The write pulse is applied in this state. As described above, for this write pulse application, the word line voltage is increased by ΔVpp in order to an prevent the lowering of a write electric field due to increase in the threshold value.

This is the end of the description of the first writing method.

A second writing method will be described below.

Figure 9:
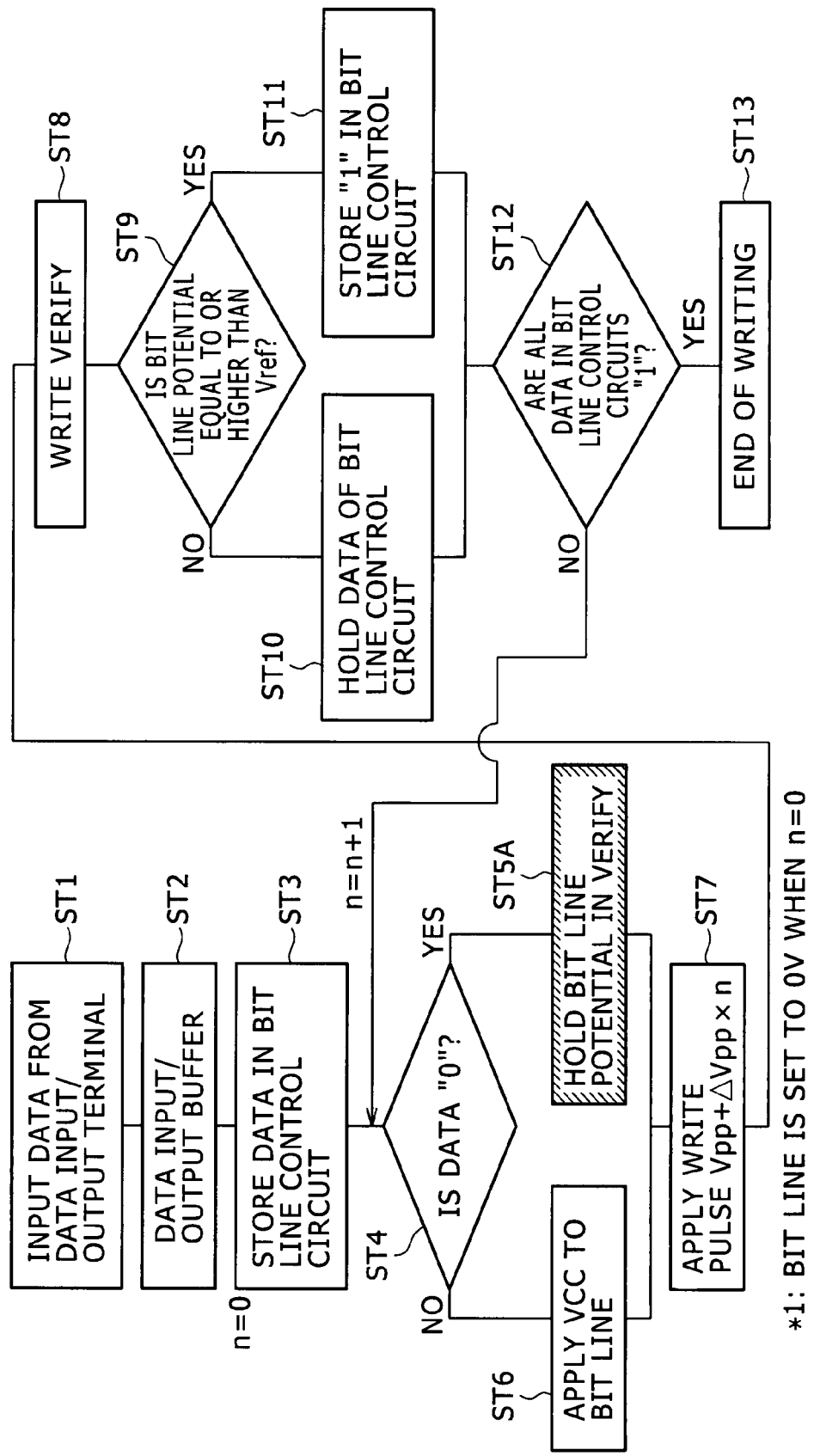
FIG. 9 is a flowchart for explaining a second writing method.

FIG. 9 is a flowchart for explaining the second writing method. FIGS. 10A to 10V are diagrams showing a sequence from write verify to the next writing, relating to the second writing method.

In FIG. 9, the same processing as that in the first writing method is given the same step numeral for easy understanding.

In the above-described first writing method, in write pulse application, the word line voltage is increased by ΔVpp in order to prevent the lowering of a write electric field due to increase in the threshold value.

However, if the voltages Vpp and ΔVpp are increased to too high of values for early completion of the writing, the extent of the writing to a bit in which the write speed is high will be too large, and thus the threshold value of the bit will surpass the voltage Vread. Therefore, there are limitations on the voltages Vpp and ΔVpp.

To address this, the processing to be described below is executed in the second writing method.

The second writing method is different from the above-described first writing method in the following point. Specifically, in the second writing method, before write pulse application, whether the data stored in the bit line control circuit 12 is "0" or "1" is determined. If the data is "0", writing is carried out in the state in which the potential of the bit line is kept at the potential at the timing of completion of verify (ST5A).

In order to keep the potential of the bit line BL in rewriting, the processing for turning the bit line potential to 0 V, executed in the period T6 of FIG. 8, is not executed, but writing is carried out with both the signals PREA and RV1A kept at "L" (T6, T7, T8 of FIG. 10).

In this rewriting, the bit line as the writing target is in the floating state. However, this leads to no problem because the capacitance of the bit line is sufficiently lower than the local channel capacitance in the memory array block.

A discussion will be made below about the write speed in the first and second writing methods.

FIGS. 11A to 11D are diagrams showing the potential state of a voltage Vwl of a selected word line and bit line potentials Vbl(1), Vbl(2), and Vbl(3), employed when the sequence of the first writing method is applied.

Figure 11A:
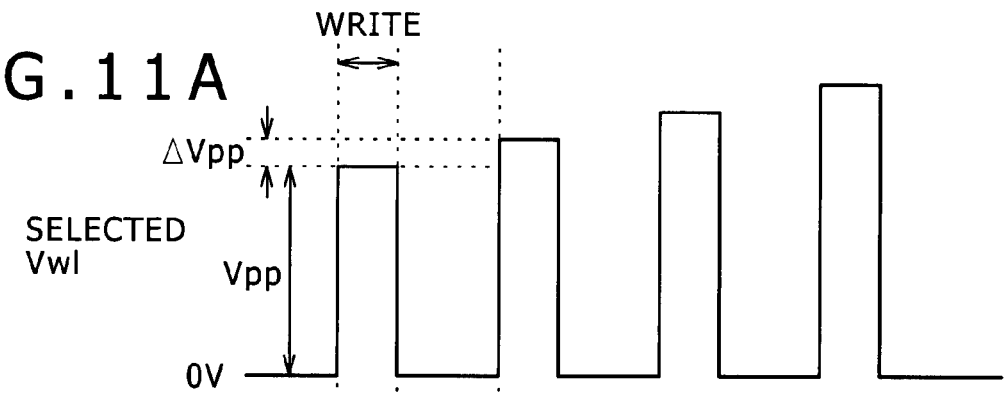
FIGS. 11A to 11D are diagrams showing the potential state of a voltage Vwl of a selected word line and bit line potentials Vbl(1), Vbl(2), and Vbl(3), employed when the sequence of the first writing method is applied.
Figure 11B:
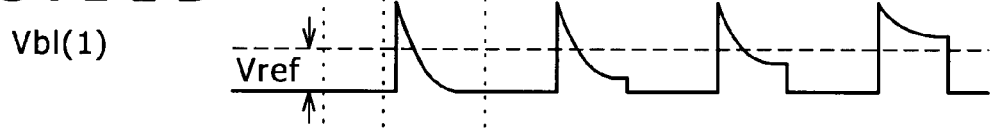
Figure 11C:
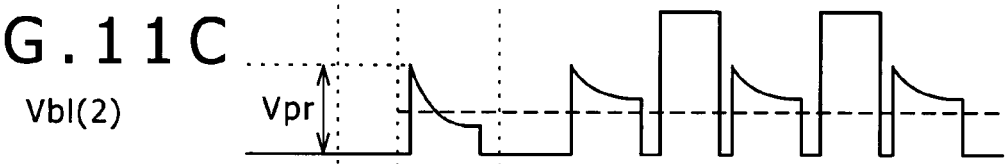
Figure 11D:
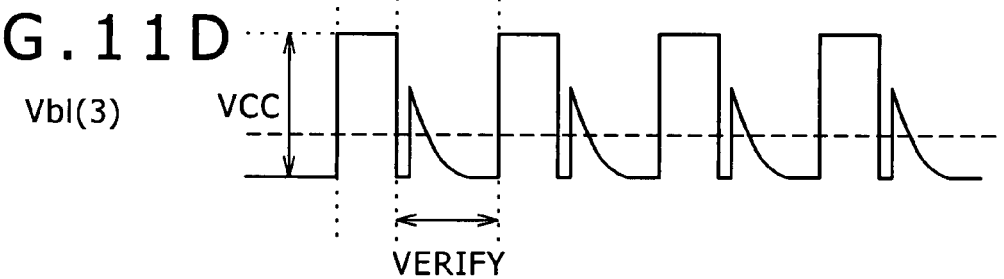
Figure 13A:
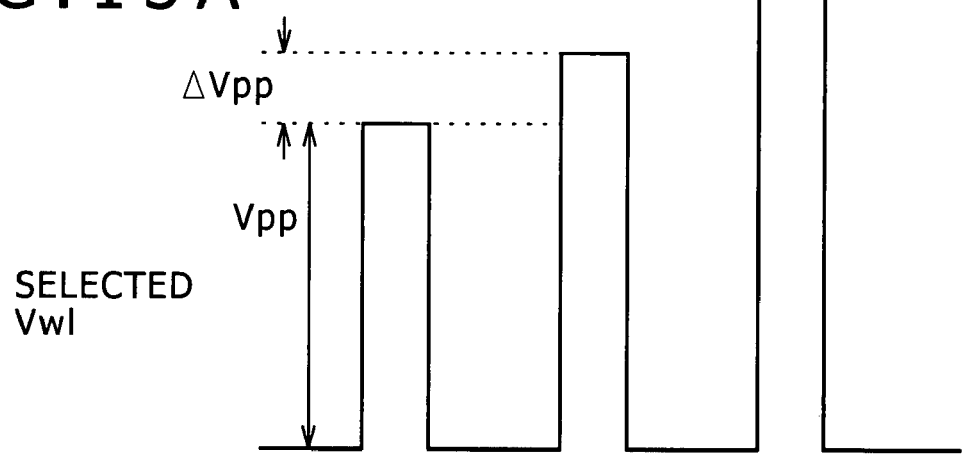
FIGS. 13A to 13D are diagrams showing the potential state of a voltage Vwl of a selected word line and bit line potentials Vbl(1), Vbl(2), and Vbl(3), employed when the sequence of the second writing method is applied.
Figure 13B:
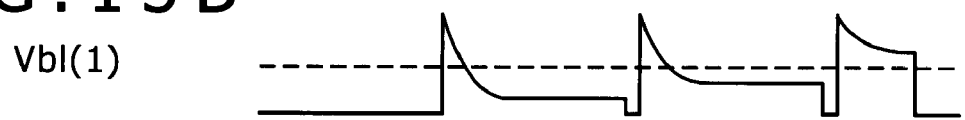
Figure 13C:
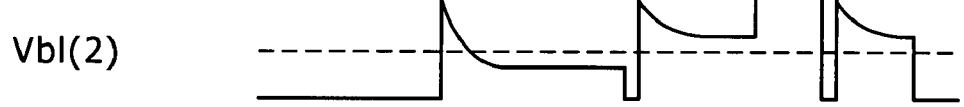
Figure 13D:
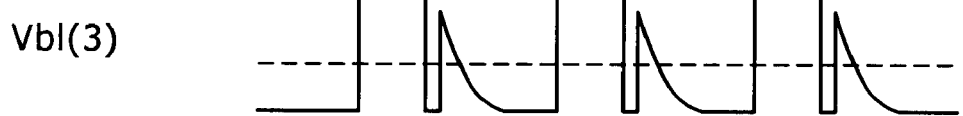

Specifically, FIG. 11A shows the potential state of the voltage Vwl of a selected word line. FIG. 11B shows the bit line potential Vbl(1). FIG. 11C shows the bit line potential Vbl(2). FIG. 11D shows the bit line potential Vbl(3).

The potential Vbl(1) indicates the potential state of a bit line connected to a bit in which the write speed is low, among writing-target memory cells.

The potential Vbl(2) indicates the potential state of a bit line connected to a bit in which the write speed is high, among the writing-target memory cells.

The potential Vbl(3) indicates the potential state of a bit line connected to a bit of which a latch in the bit line data control circuit stores therein as initial data "1".

FIGS. 11A to 11D show an example in which write pulse application and write verify are repeated until write verify for the bit in which the write speed is low results in a determination of "Pass" (Vbl>Vref).

The noteworthy point in this example is that the bit line potential Vbl is set to 0 V at the time of the write pulse application for both the bit of high write speed and the bit of low write speed. Therefore, as shown in FIG. 12, writing is carried out at constant write speed for both the bit of high write speed and the bit of low write speed.

If the initial data in the bit line control circuit 12 is "1" or if "Pass" has been determined through write verify, the voltage VCC is selectively applied as the bit line potential Vbl in the bit line control circuit 12.

FIGS. 13A to 13D are diagrams showing the potential state of a voltage Vwl of a selected word line and bit line potentials Vbl(1), Vbl(2), and Vbl(3), employed when the sequence of the second writing method is applied.

The noteworthy point here is that in the write pulse application, writing is carried out in the state in which the potential state obtained at the time of the previous write verify is kept.

Specifically, at the time of the write pulse application, writing is carried out in the state in which the history of the threshold value of each writing-target memory cell is held in the corresponding bit line in an analogous manner: the potential of the bit line for a bit having a high threshold value is set high, while the potential of the bit line for a bit having a low threshold value is set low.

Figure 14:
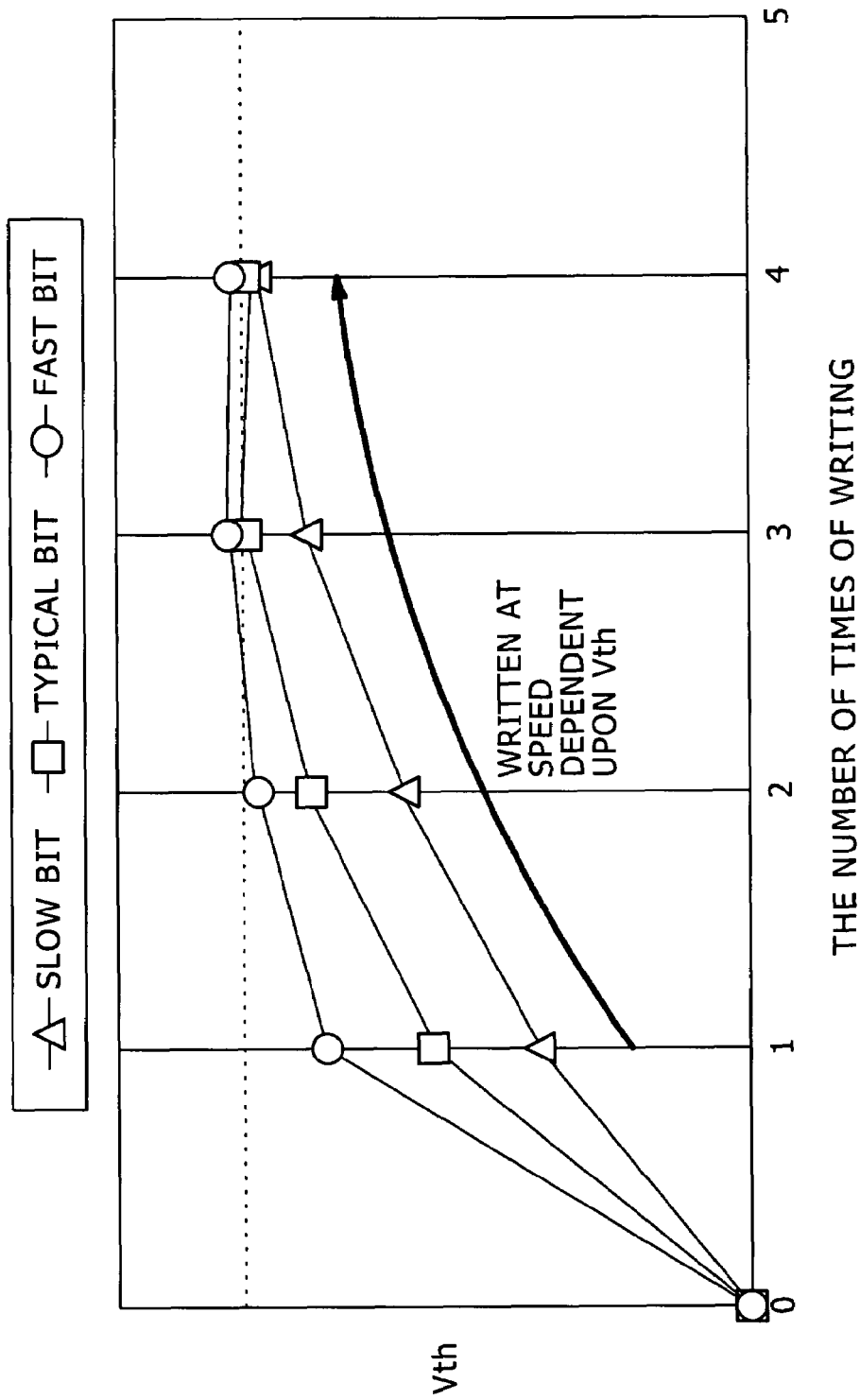
FIG. 14 is a diagram showing the relationships between the number of times of writing and the threshold voltage in the second writing method.

Thus, as shown in FIG. 14, writing is carried out strongly when the threshold value is greatly lower than the desired value that allows write verify to result in a determination of "Pass". In contrast, in the state in which the threshold value has been increased to near the desired value, writing is carried out weakly. Therefore, even when the write speed is enhanced through increase in the voltages Vpp and ΔVpp, narrowed distribution can be obtained and influence, due to variation in the original write speed, can be suppressed.

In the second writing method, through every write verify, the write speed is adjusted for each bit based on the history of the corresponding bit line. Therefore, even when the voltage Vpp is set sufficiently high originally, too much increase in the threshold value due to overwriting is suppressed, which permits even a control scheme that does not demand an increment of the write bias by ΔVpp.

According to FIG. 9, in the second writing method, the bit line potential is fixed at 0 V when n is zero. Alternatively, read operation may be carried out in advance before the start of the above-described write operation, and the history of the bit line may be left so that writing with the bit line potential kept can be carried out when n is zero.

Binary data writing has been described above. An example of application of an embodiment of the present invention to a multiple-valued memory will be described below.

For a multiple-valued memory, increasing of the write speed and reliability enhancement through distribution narrowing are big challenges. However, an embodiment of the present invention is effective also for multiple-valued data writing.

Figure 15:
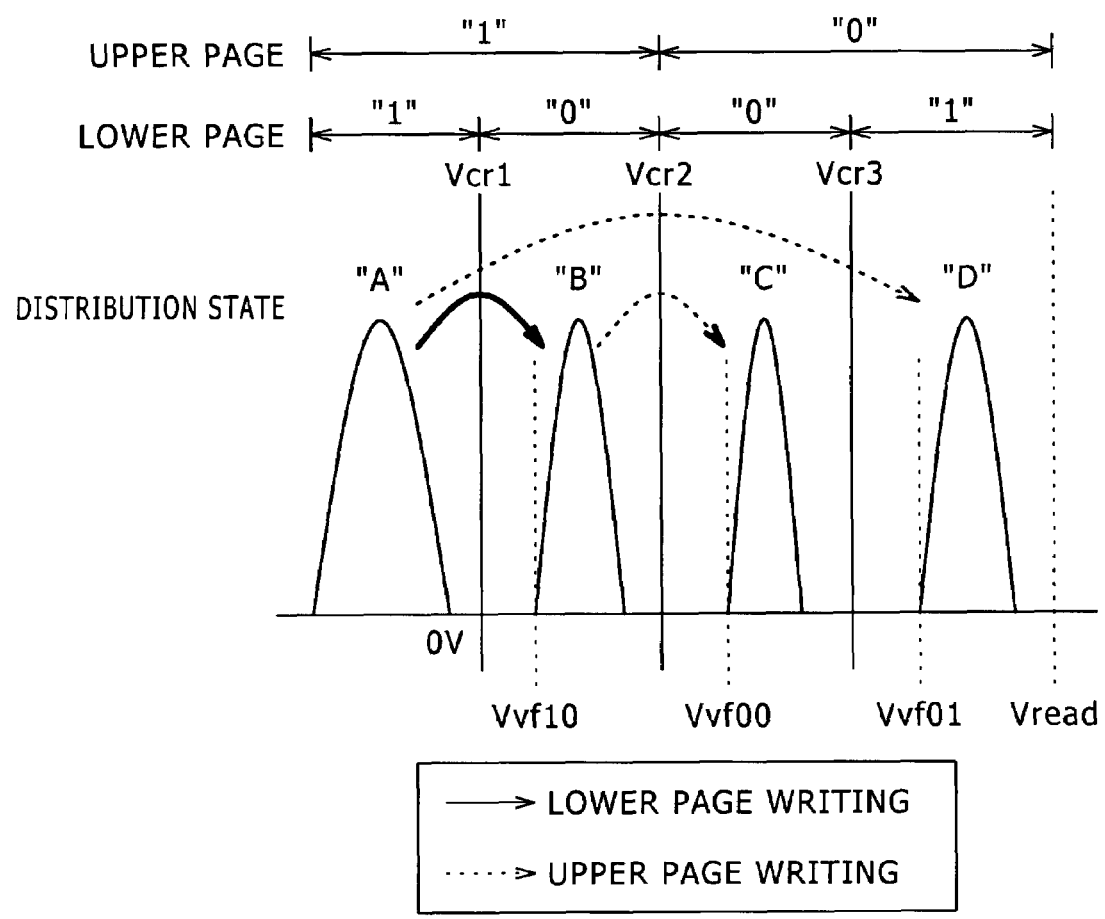
FIG. 15 is a diagram showing one example of distributions in a multiple-valued (four-valued) memory.

FIG. 15 is a diagram showing one example of distributions in a multiple-valued (four-valued) memory.

In this example, one memory cell includes the distribution states of four threshold values "A" to "D". The states of the upper and lower pages each corresponding to a respective one of four threshold values are defined as shown in the drawing.

In writing of memory threshold value distributions like those in FIG. 15, the processing of a first step and a second step is executed. In the first step, initially writing for the lower page is carried out. In the second step, after the completion of the writing for the lower page, writing for the upper page is carried out.

In the first step, writing can be carried out similarly to the first and second writing methods, and the distribution "A" or "B" is obtained as the resultant distribution.

In the writing for the upper page, the already-written lower page data is read out with the potential of a selected word line set to Vcr1 so that the read data is stored in the latch circuit FF2 in FIG. 6.

The bit line of the distribution "A" is at "L", while the bit line of the distribution "B" is at "H". Therefore, the node N5C is set to "L" when the read data corresponds to the distribution "A", while the node N5C is set to "H" when the read data corresponds to the distribution "B".

Subsequently, similarly to binary writing, the upper page data is loaded from the host into the latch circuit FF1. When the upper page data is "0", and thus the memory cell is a writing target, writing is carried out with the bit line potential fixed at 0 V similarly to binary writing. When the upper page data is "1", and thus the memory cell is not a writing target, the voltage VCC is applied to the bit line, and thus writing is not carried out.

FIGS. 16A to 16Z are diagrams showing a sequence from write verify for the upper page to the next writing.

In the write verify for the upper page, initially the signals BLCA and PREA are turned to "H", and the voltage VA is set to 1.8 V. This operation precharges all the bit line potentials to 1.8 V (T1 of FIG. 16). Subsequently, a potential Vrf01 is applied to a selected word line so that memory-discharge is carried out (T2 of FIG. 16).

Subsequently, the signal BLCA is turned to "H" so that the potential of the bit line may be transferred to the node N1, and then the node N1 is isolated from the node of the bit line (the signal BLCA is turned to "L"). This operation allows the data to be held by the capacitor C1 connected to the node N1. Thereafter, when the signal VRFYBAC is turned t "L", the node N1 corresponding to a bit that is not selected for the upper page writing, i.e., a bit of the distribution "A" or "B", is charged to VCC (T3 of FIG. 16).

In this state, the signal VRFYBAC is returned to "H", and the signals SAP1, SAN1, and ECH1 are turned to "H", "L", and "H", respectively, to thereby equalize the nodes N3C and N4C. This clears the data in the latch circuit FF1. Subsequently, upon turning of the signal RV1A to "H", sensing is started (T4 of FIG. 16).

When the latch data in the latch circuit FF1 is determined, data "1" is given to the latch circuits FF1 for the bits of the distributions "A" and "B", and, the bits to which the distribution "D" should be written, for the bits of which threshold value has been set to Vrf01 or more through the writing, i.e., the bits for which the write verify for "D" has resulted in "Pass" (T5 of FIG. 16).

At this time, the write pulse should be so adjusted that the threshold values of the bits to which the distribution "C" should be written are not suddenly set to Vrf01 or more.

Subsequently, all the bit lines are set to 0 V (T6 of FIG. 16), and then all the bit lines are precharged to 1.8 V again (T7 of FIG. 16), followed by memory-discharge in the state in which the potential of the selected word line WL is set to Vrf00 (T8 of FIG. 16). Thereafter, the signal BLCA is turned to "H" so that the bit line potential may be charge-shared with the node N1. In this state, the signal VRFYBA1C is set to "H". Due to this operation, charges are drawn out selectively from the bit line for the bit of which node N5C is at "L", i.e., the bit to which the distribution "D" should be written so that the potential of the bit line becomes 0 V (T9 of FIG. 16).

Subsequently, the signal VRFYBAC is returned to "L" so that the bit line potentials of the bit that is not selected for the upper page writing and the bit for which the write verify for "D" has resulted in "Pass" are precharged to VCC (T10 of FIG. 16).

In this state, similar to the above description, the latch circuit FF1 is cleared, and then the signal RV1A is turned to "H" for sensing (T11 of FIG. 16), followed by a determination of the latch data in the latch circuit FF1 (T12 of FIG. 16). Due to this operation, data "0" is stored in the latch circuits FF1 connected to the bits for which the verify has resulted in "Fail" due to insufficiency of writing of "C" and "D" so that one time of the write verify is completed.

When the sequence moves to the next writing, the signal VRFYBAC is turned to "L", and the signal BLCA is turned to "H". Thus, the bit lines of the bits that are not selected for writing, i.e., the bit lines of the bits of the distributions "A" and "B" and the bit lines of the bits to which the distributions "C" and "D" have been written sufficiently are charged to VCC. In contrast, for the bits to which the distribution "C" has not been written sufficiently, writing is carried out in the state in which the bit line potentials obtained at the time of completion of the previous write verify are kept. Furthermore, as for the bits to which the distribution "D" has not been written sufficiently, rewriting is carried out with all the bit line potentials set to 0 V (T13, T14, T15 of FIG. 16).

By this writing with such bit-line states, strong writing is carried out for the bits to which "D" should be written. Furthermore, due to advantages of the present embodiment, the writing to the bits to which "C" should be written is carried out at high speed and offers a narrowed distribution.

In the above-described example, an embodiment of the present invention is applied to the distribution "C" for high speed writing and distribution narrowing, and a window margin for the distribution "D" is assured. Alternatively, it is also possible to apply an embodiment of the present invention to the distribution "D" for high speed writing and distribution narrowing.

Figure 17:
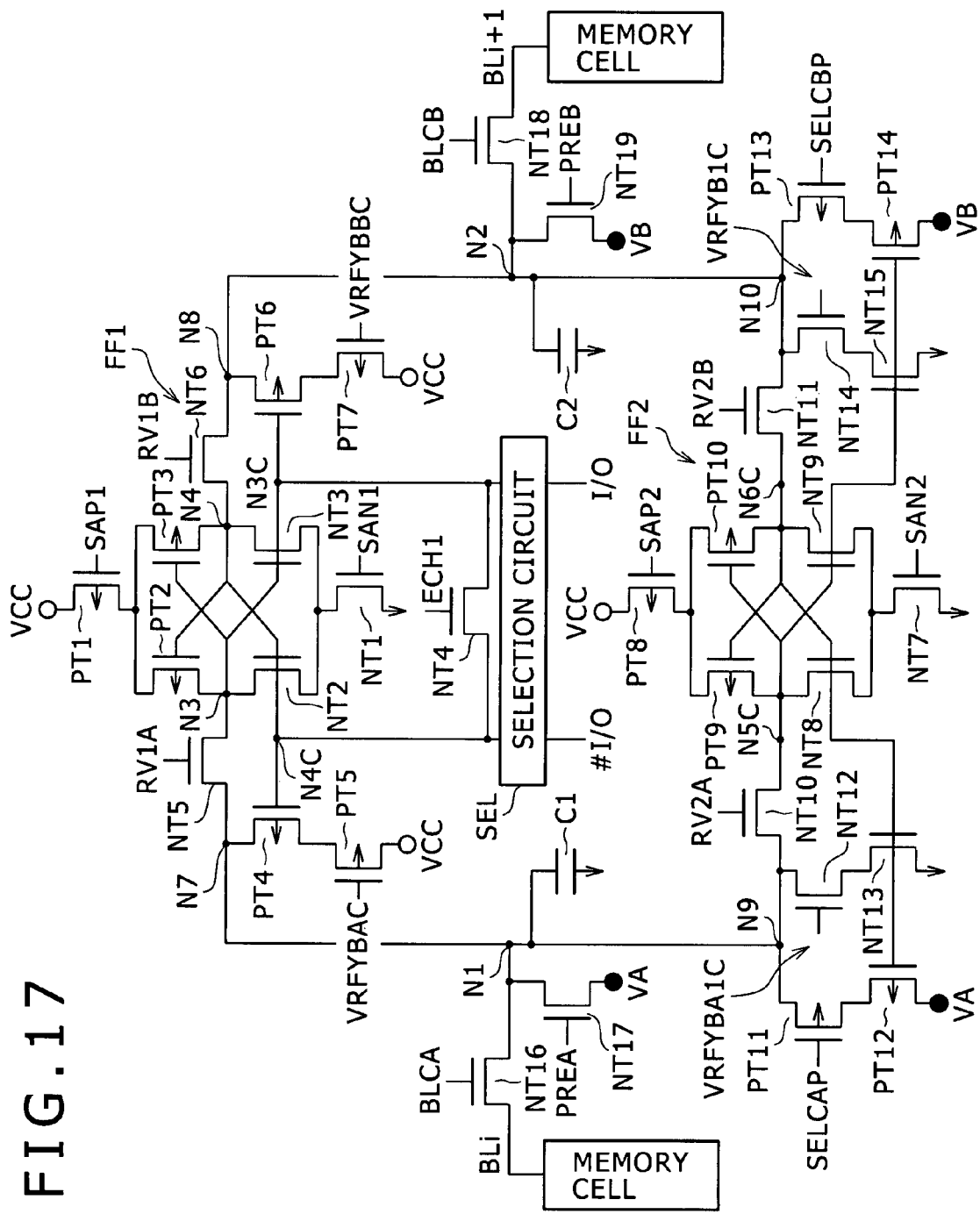
FIG. 17 is a diagram showing another configuration example of a data memory circuit in a bit line control circuit for a multiple-valued memory.

FIG. 17 is a diagram showing another configuration example of a data memory circuit in a bit line control circuit for a multiple-valued memory.

A data memory circuit 19B of FIG. 17 has a configuration obtained by adding, to the data memory circuit 19 of FIG. 6, PMOS transistors PT11 and PT12 connected to the node N9 and PMOS transistors PT13 and PT14 connected to the node N10.

The drain of the PMOS transistor PT11 is connected to the node N9, and the source thereof is connected to the drain of the PMOS transistor PT12. The source of the PMOS transistor PT12 is connected to a supply line for the voltage VA.

The gate of the PMOS transistor PT11 is connected to a supply line for a signal SELCAP, and the gate of the PMOS transistor PT12 is connected to the node N6C, similar to the gate of the NMOS transistor NT13.

The drain of the PMOS transistor PT13 is connected to the node N10, and the source thereof is connected to the drain of the PMOS transistor PT14. The source of the PMOS transistor PT14 is connected to a supply line for the voltage VB.

The gate of the PMOS transistor PT13 is connected to a supply line for a signal SELCBP, and the gate of the PMOS transistor PT14 is connected to the node N5C similarly to the gate of the NMOS transistor NT15.

Also, in writing by use of the circuit of FIG. 17, the operation sequence is similar to that in the above-described method until the completion of the lower page writing.

Furthermore, also in the upper page writing, the operation sequence is similar to that in the above-described embodiment until the first writing, subsequent to loading of the upper page data from the host into the latch circuit FF1, is completed after the already-written lower page data is read out and stored in the latch circuit FF2 with the potential of a selected word line set to Vcr1.

FIGS. 18A to 18a are diagrams showing the sequence of write verify for the upper page, employed when the circuit of FIG. 17 is used.

In the write verify for the upper page, initially all the bit line potentials are precharged to 1.8 V (T1 of FIG. 18), and then a potential Vrf00 is applied to a selected word line so that memory-discharge is carried out (T2 of FIG. 18). Subsequently, the potential of the bit line is charge-shared with the node N1, and then the signal VRFBA1C is turned to "H" so that the node N1 of the bit to which "D" should be written is turned to "L" (T3 of FIG. 18). Thereafter, the signal VRFY-BAC is turned to "L" so that the nodes N1 connected to the bits that are not selected for the upper page writing, i.e., the bits of the distributions "A" and "B", are charged to VCC (T4 of FIG. 18).

In this state, sensing is carried out (T5 of FIG. 18), and then the latch data in the latch circuit FF1 is determined. Due to this operation, data "1" is stored in the latch circuits FF1 for the bits that are not selected for the upper page writing and the bits to which "C" has been written sufficiently (T6 of FIG. 18).

Subsequently, all the bit lines are set to 0 V (T7 of FIG. 18), and then all the bit lines are precharged to 1.8 V again (T8 of FIG. 18), followed by memory-discharge in the state in which the potential of the selected word line is set to Vrf01 (T9 of FIG. 18). Thereafter, the signal BLCA is turned to "H" so that the bit line potential may be charge-shared with the node N1, and then the signal VRFYBAC is turned to "L". Due to this operation, the bit line potentials are precharged to VCC only for the bits that are not selected for the upper page writing and the bits for which the write verify for "C" has resulted in "Pass" (T10 of FIG. 18).

In this state, as described above, the latch circuit FF1 is cleared, and then the signal RV1A is turned to "H" for sensing (T11 of FIG. 18), followed by determination of the latch data in the latch circuit FF1. Due to this operation, data "0" is stored in the latch circuits FF1 connected to the bits for which the verify has resulted in "Fail" due to insufficiency of writing of "C" and "D" so that one time of the write verify is completed (T12 of FIG. 18).

When the sequence moves to the next writing, the potential VA is set to any potential (e.g., 1 V, 1.8 V, or 2 V), and the signal SELCAP is turned to "L". This allows the potential VA to be charged to the bit lines of the bits to which "B" and "C" are written, while the potentials of the bit lines of the bits to which "D" should be written are kept (T13 of FIG. 18).

Subsequently, the signal SELCAP is returned to "H", and then the signal VRFYBAC is turned to "L". Due to this operation, the bit lines of the bits to which "A" and "B" are written and the bits to which "C" and "D" are written sufficiently and thus for which the verify has resulted in "Pass" are charged to VCC (T14 of FIG. 18).

In this state, the write pulse is applied to a selected word line. Because the potential VA is applied to the bit lines of the bits for which the verify has resulted in "Fail" due to insufficiency of writing for the distribution "C", the writing for "C" is weakly carried out. Furthermore, because the bit line potentials obtained at the time of completion of the write verify for "D" are held as the potentials of the bit lines of the bits for which the verify for the distribution "D" has resulted in "Fail", the writing for "D" is carried out at high speed and offers a narrowed distribution due to advantages of an embodiment of the present invention.

For the embodiment of FIG. 18, PMOS transistors should be added to the circuit configuration of FIG. 6 as shown in FIG. 17. However, similar operation can be realized even with the circuit configuration of FIG. 6.

FIG. 19 is a diagram showing the sequence of write verify for the upper page, employed when not the circuit of FIG. 17 but the circuit of FIG. 6 is used.

In this sequence, the operation of charging the bit line for weak writing for the distribution "C", from the timing of the completion of the write verify in the above-described embodiment, can be realized by using the potential at the node N5C in the latch circuit FF2.

Specifically, the bit line charging, which is carried out based on the signal SELCAP in the period T13 in FIG. 18, is controlled based on the potential of the signal RV2A.

However, sharp rising-up of the signal RV2A will possibly lead to destruction of the latch data in the latch circuit FF2. Therefore, control to increase the potential of the signal RV2A in a stepwise manner or with a gentle slope is requisite.

In the above-described examples, in the upper page writing, either writing for the distribution "C" or writing for the distribution "D" is carried out in the state in which the bit line potential obtained at the time of completion of verify is kept. However, there is also a method that allows both the writing to be carried out in this manner.

In this method, write verify is carried out in a manner similar to that of the sequence of the embodiment shown in FIG. 16. However, in the selective discharging of the bit lines of the bits to which "D" should be written in the period T9 of FIG. 16, the potential of the signal VRFYBA1C is set to a potential lower than VCC (e.g., 1.8 V) and the discharging is selectively carried out for a short period so that the bit line potential will not become 0 V.

Furthermore, in the above-described examples, in the upper page writing, the threshold values according to the lower page are read out in advance so as to be latched in the latch circuit FF2. It is also possible to hold the bit line potential obtained at the time of the data reading and carry out the first writing with this bit line potential held.

It should be understood by those skilled in the art that various modifications, combinations, sub-combinations and alterations may occur depending on design requirements and other factor in so far as they are within the scope of the appended claims or the equivalents thereof.

What is claimed is:

1. A nonvolatile semiconductor memory device comprising:
    a first selection transistor connected to a bit line;
    a second selection transistor connected to a common source line;
    a memory cell connected in series between the first and second selection transistors; and
    writing means for carrying out a writing on the memory cell; wherein
    the writing means is configured to apply a potential corresponding to a writing-blocked state via the bit line to the memory cell when the writing is not carried out, and the writing means applies a potential voltage to the bit line corresponding to a threshold value when the writing is carried out on the memory cell.

2. The nonvolatile semiconductor memory device according to claim 1, further comprising:
    a reading means for reading the memory cell; and
    a write verifying means for detecting whether the memory cell has reached a desired threshold value; wherein
    the writing means applies a potential to the bit line corresponding to the potential at the time of completion of a prior write verify or a read operation depending on a threshold value stored in the memory cell.

3. The nonvolatile semiconductor memory device according to claim 1, wherein the threshold value is higher than a ground potential and lower than the potential corresponding to the writing-blocking state.

4. The nonvolatile semiconductor memory device according to claim 1, wherein
the writing means writes to the memory cell while the bit line potential is held at a value dependent upon the memory cell threshold value.

5. The nonvolatile semiconductor memory device according to claim 1, wherein
if the hit line potential is increased for writing, after a write verify, the writing means increases the bit line potential by a set amount.

6. The nonvolatile semiconductor memory device according to claim 1, wherein
a read operation is carried out before a first writing and the first writing is carried out while the bit line potential remains the same as when the read operation was completed.

7. The nonvolatile semiconductor memory device according to claim 1, wherein
the memory cell is a multiple-valued memory cell capable of storing three or more threshold values.

8. The nonvolatile semiconductor memory device according to claim 7, wherein
the memory cell is a multiple-valued memory in which four threshold values "A", "B", "C", and "D" can be stored, the threshold value "A" representing an erased state, the threshold values "A", "B", "C", and "D" being in increasing order, and
when writing, the writing means initially executes a first process for writing the threshold value "B" and then executes a second process for simultaneously writing the threshold values "C" and "D", and during the first process the writing means keeps the bit line at a potential dependent upon the threshold value of the memory cell.

9. The nonvolatile semiconductor memory device according to claim 8, wherein
if in the simultaneous writing of the threshold values "C" and "D" in the second process, a write verify for "D" subsequent to write potential application is carried out and then write verify for "C" followed by the next writing is carried out, then the writing means simultaneously writes "C" and "D" in a state in which a bit line potential for writing a threshold value of "D" is set to a reference potential and a bit line potential obtained at the time of completion of the write verify for a threshold value of "C" is held as a bit line potential for writing the threshold value of "C".

10. The nonvolatile semiconductor memory device according to claim 8, wherein
if in the simultaneous writing of the threshold values "C" and "D" in the second process, a write verify for "C" subsequent to write potential application is carried out and then write verify for "D" followed by the next writing is carried out, the writing means carries out writing of the second process in a state in which a bit line potential for writing a threshold value of "C" is set to a predetermined potential and a bit line potential obtained at the time of completion of the write verify for a threshold value of "D" is held as a bit line potential for writing to the distribution of "D".

11. The nonvolatile semiconductor memory device according to claim 8, wherein
if in simultaneous writing of the threshold values "C" and "D" in the second processing, write verify for "D" subsequent to the writing for "D" is carried out and then write verify for "C" followed by the next writing is carried out, the writing means carries out writing of the second process in a state in which a bit line potential for writing to a threshold value of "D" is set to a potential resulting from a change from a bit line potential obtained at the time of completion of the write verify for "D" due to drawing out of a certain amount of charges and a bit line potential obtained at the time of completion of the write verify for a threshold value of "C" is held as a bit line potential for writing to the threshold value of "C".

12. The nonvolatile semiconductor memory device according to claim 8, wherein
after a threshold value of a memory cell is set to a threshold value of "A" or "B" through the first process and before the second process is executed, reading is carried out in a state in which a potential for distinguishing between "A" and "B" is applied to a gate electrode of the memory cell, and first writing for simultaneous writing of the threshold values "C" and "D" is carried out in a state in which a state of the memory cell is held in a bit line potential.

13. The nonvolatile semiconductor memory device according to claim 7, wherein
the memory cell is a multiple-valued memory in which four threshold values "A", "B", "C", and "D" are stored, the threshold value of "A" representing an erased state, the threshold values "A", "B", "C", and "D" being in increasing order, and
a writing and write verify are carried out for the threshold values "B", "C", and "D" sequentially and independently of each other, and in each writing for a respective distribution; the writing means applies a potential to the bit line of the memory cell corresponding to a writing-blocked state, and the writing means carries out writing to the memory cell in a state in which the bit line has a bit line potential corresponding to the threshold value when the writing is carried out on the memory cell.

14. A writing method of a nonvolatile semiconductor memory device that includes a first selection transistor connected to a bit line, a second selection transistor connected to a common source line, and at least one memory cell connected in series between the first and second selection transistors, the method comprising the step of
applying a potential corresponding to a writing-blocked state via a bit line to the memory cell when writing is not carried out, and applying a potential to the bit line corresponding to a threshold value when a writing is carried out on the memory cell.

15. The writing method of a nonvolatile semiconductor memory device according to claim 14, wherein
in carrying out the writing, the bit line potential corresponds to a threshold value at the time of completion of a prior write verify or read operation.

16. The writing method of a nonvolatile semiconductor memory device according to claim 14, wherein
the memory cell is a multiple-valued memory capable of storing three or more threshold value levels.

17. The writing method of a nonvolatile semiconductor memory device according to claim 16, wherein
the memory cell is a multiple-valued memory in which four threshold values "A", "B", "C", and "D" are stored, the threshold value "A" representing an erased state, the threshold values "A", "B", "C", and "D" being in increasing order, and during a writing, initially a first step for writing the threshold value "B" is carried out and then a second step for simultaneously writing the threshold values "C" and "D" is carried out, and in the first step, and during the writing the bit line potential is dependent upon the threshold value of the memory cell.

18. The writing method of a nonvolatile semiconductor memory device according to claim 16, wherein the memory cell is a multiple-valued memory in which four threshold values "A", "B", "C", and "D" are stored, the distribution of "A" representing an erased state, the threshold values "A", "B", "C", and "D" being in increasing order, and wherein the writing and write verify are carried out for the threshold values "B", "C", and "D" sequentially and independently of each other, and during each writing for each respective threshold value, writing-blocked voltage is applied via the bit line to the memory cell when the writing is not carried out, and during the writing, the bit line potential corresponds to the threshold value of the memory cell.

* * * * *